US008008123B2

(12) United States Patent
Miki

(10) Patent No.: US 8,008,123 B2
(45) Date of Patent: Aug. 30, 2011

(54) MANUFACTURING METHOD OF SEMICONDUCTOR DEVICE

(75) Inventor: Syota Miki, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 12/892,993

(22) Filed: Sep. 29, 2010

(65) Prior Publication Data

US 2011/0151645 A1   Jun. 23, 2011

(30) Foreign Application Priority Data

Dec. 18, 2009   (JP) .................................. 2009-287903

(51) Int. Cl.
*H01L 21/00* (2006.01)

(52) U.S. Cl. ........ 438/107; 438/108; 438/109; 438/127; 257/E23.001; 257/E21.499

(58) Field of Classification Search .......... 438/107–109, 438/127, FOR. 369; 257/E23.001, E21.499
See application file for complete search history.

(56) References Cited

U.S. PATENT DOCUMENTS

| 6,348,728 B1 | 2/2002 | Aiba et al. | |
| 2006/0091561 A1* | 5/2006 | Dangelmaier et al. | ........ 257/778 |
| 2008/0111233 A1* | 5/2008 | Pendse | .......................... 257/712 |
| 2009/0261466 A1* | 10/2009 | Pagaila et al. | ................. 257/686 |

FOREIGN PATENT DOCUMENTS

| JP | 2001-217381 | 8/2001 |
| JP | 2001-298149 | 10/2001 |

* cited by examiner

*Primary Examiner* — Michelle Estrada
(74) *Attorney, Agent, or Firm* — IPUSA, PLLC

(57) ABSTRACT

A manufacturing method of a semiconductor device, including a first step of forming a first electrode pad at an external edge part of a semiconductor chip mounting area of a supporting board; a second step of fixing a rear surface of a semiconductor chip having a main surface, the main surface where a second electrode pad is formed, to an inside of an area of the main surface of the supporting board, the area where the first electrode pad is formed; a third step of forming a first internal connecting terminal on the first electrode pad, and forming a second internal connecting terminal on the second electrode pad; and a fourth step of forming a first insulation layer on the main surface of the supporting board.

4 Claims, 38 Drawing Sheets

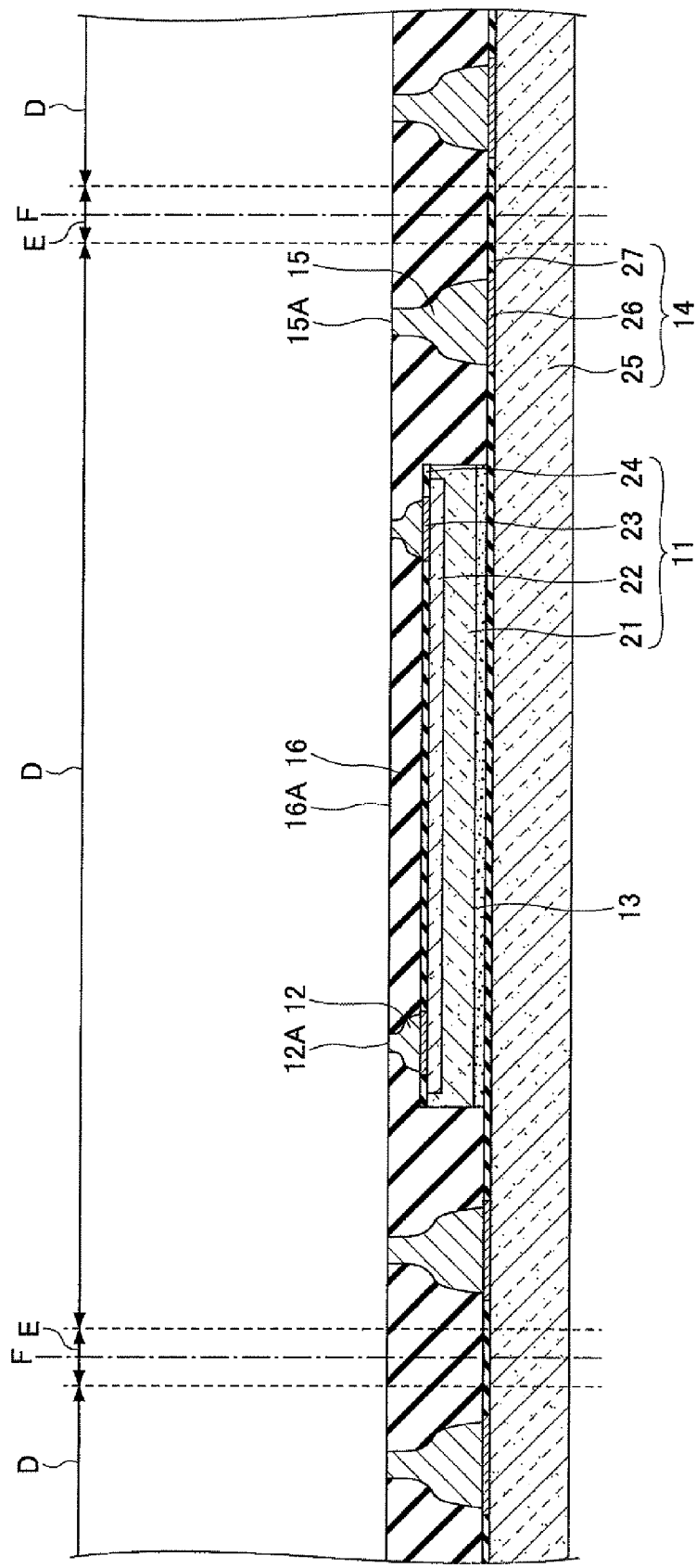

US 8,008,123 B2

MANUFACTURING METHOD OF SEMICONDUCTOR DEVICE

CROSS-REFERENCE TO RELATED APPLICATIONS

This patent application is based upon and claims the benefit of priority of Japanese Patent Application No. 2009-287903 filed on Dec. 18, 2009, the entire contents of which are incorporated herein by reference.

BACKGROUND OF THE INVENTION

1. Field of the Invention

The present invention generally relates to manufacturing methods of semiconductor devices.

More specifically, the present invention relates to a manufacturing method of a semiconductor device where a wiring pattern is formed on a semiconductor chip.

2. Description of the Related Art

In recent years, miniaturization, reducing thickness, and reducing weight of semiconductor application products have been drastically progressing for use of digital cameras and various mobile devices such as mobile phones. Because of this, for example, miniaturization and high density are required for a semiconductor device such as NAND type flash memory. A semiconductor device as illustrated in FIG. 1, a so-called CSP (chip size package), for example, has been suggested. The CSP has a substantially same configuration, in planar view, as a semiconductor chip. In addition, a low manufacturing cost, as well as miniaturization and high density, is strongly required in such a semiconductor device.

Here, a related art semiconductor device and its manufacturing method are discussed with reference to FIG. 1 through FIG. 11. FIG. 1 is a cross-sectional view of an example of the related art semiconductor device. As illustrated in FIG. 1, a related art semiconductor device 100 includes a semiconductor chip 101, internal connecting terminals 102, an insulation layer 103, wiring patterns 104, solder resist 106, and external connecting terminals 107.

The semiconductor chip 101 includes a thin plate-shaped semiconductor substrate 109, a semiconductor integrated circuit 111, plural electrode pads 112, and a protection film 113. The semiconductor substrate 109 is formed by, for example, cutting a thin plate-shaped Si wafer into pieces.

The semiconductor integrated circuit 111 is provided on a surface of the semiconductor substrate 109. The semiconductor integrated circuit 111 is formed of a diffusion layer, an insulation layer, a via, wiring and other parts (not illustrated in FIG. 1). The plural electrode pads 112 are provided on the semiconductor integrated circuit 111, and are electrically connected to wirings provided at the semiconductor integrated circuit 111. The protection film 113 is provided on the semiconductor integrated circuit 111. The protection film 113 is configured to protect the semiconductor integrated circuit 111.

The internal connecting terminals 102 are provided on the electrode pads 112. Upper end parts of the internal connecting terminals 102 are exposed from the insulation layer 103 so as to be connected to the wiring patterns 104. The insulation layer 103 is provided so as to cover a surface of the semiconductor chip 101 where the internal connecting terminals 102 are provided. As the insulation layer 103, for example, sheet insulation resin having adhesive properties such as NCF (Non-Conductive Film) or the like can be used.

The wiring patterns 104, which may be so-called re-wirings, are provided so that positions of the electrode pads 112 are different from positions of the external connecting terminals 107. In other words, a so-called fan-in structure for pitch conversion is formed. The wiring patterns 104 are provided on the insulation layer 103. The wiring patterns 104 are connected to the internal connecting terminals 102. The wiring patterns 104 are electrically connected to the electrode pads 112 via the internal connecting terminals 102. The wiring patterns 104 have external connecting terminal providing areas 104A where the external connecting terminals 107 are provided. The solder resist 106 is provided on the insulation layer 103 so as to cover the wiring patterns 104 other than the external connecting terminal providing areas 104A.

The external connecting terminals 107 are provided in the external connecting terminal providing areas 104A of the wiring patterns 104. The external connecting terminals 107 are connected to the wiring patterns 104. As materials of the external connecting terminals 107, for example, an alloy including Pb, an alloy of Sn and Cu, an alloy of Sn and Ag, an alloy of Sn, Ag, and Cu, and other metals and alloys can be used.

FIG. 2 is a plan view of an example of a semiconductor substrate on which is formed the related art semiconductor device. In FIG. 2, a numerical reference 110 denotes a semiconductor substrate. In FIG. 2, "C" represents a position (hereinafter "cutting position C") where the semiconductor substrate 110 is cut by a dicer. As illustrated in FIG. 2, the semiconductor substrate 110 includes plural semiconductor device forming areas A and scribing areas B where the semiconductor device forming areas A are separated from each other. The semiconductor device forming areas A are where the semiconductor devices 100 are formed. By making the semiconductor substrate 110 have a thin plate-shape configuration and cutting at the cutting positions C, the semiconductor substrates 109 discussed with reference to FIG. 1 are formed.

FIG. 3 through FIG. 11 are first through ninth views showing an example of a manufacturing process of the related art semiconductor device. In FIG. 3 through FIG. 11, parts that are the same as the parts of the related art semiconductor device 100 illustrated in FIG. 1 are given the same reference numerals, and explanation thereof may be omitted. In FIG. 3 through FIG. 11, "A" denotes a semiconductor device forming area (hereinafter "semiconductor device forming area A"). "B" denotes a scribing area B where the semiconductor device forming areas A are separated from each other (hereinafter "scribing area B"). "C" denotes a position (hereinafter "cutting position C") where the semiconductor substrate 110 is cut by a dicer.

First, in a step illustrated in FIG. 3, a semiconductor chip 101 having the semiconductor integrated circuit 111, plural electrode pads 112, and the protection film 113 is formed at a surface of the semiconductor substrate 111 which is not yet made to have a thin plate-shaped configuration. Next, in a step illustrated in FIG. 4, the internal connecting terminals 102 are formed on the electrode pads 112. In this step, there is unevenness of the heights of the plural internal connecting terminals 102.

Next, in a step illustrated in FIG. 5, a flat plate 115 is pressed onto the plural internal connecting terminals 102 so that the heights of the internal connecting terminals 102 are made even. In other words, a leveling process is performed. Next, in a step illustrated in FIG. 6, the insulation layer 103 made of resin is formed so as to cover the internal connecting terminals 102 and the surface of the semiconductor chip 101 where the internal connecting terminals 102 are formed. As the insulation layer 103, for example, the sheet insulation resin having the adhesive properties such as the NCF (Non-Conductive Film) or the like can be used.

Next, in a step illustrated in FIG. 7, the insulation layer 103 is ground until surfaces 102A of the internal connecting terminals 102 are exposed from the insulation layer 103. At this time, the grinding is performed so that a surface 103A of the insulation layer 103 is made flush with the surfaces 102A of the internal connecting terminals 102. As a result of this, a surface of a structural body illustrated in FIG. 7 (more specifically, the surface 103A of the insulation layer 103 and the surfaces 102A of the internal connecting terminals 102) becomes flat.

Next, in a step illustrated in FIG. 8, the wiring patterns 104 are formed on the flat surface of the structural body illustrated in FIG. 7. More specifically, for example, a metal foil (not illustrated in FIG. 8) is adhered to the structural body illustrated in FIG. 7. Then, resist (not illustrated in FIG. 8) is applied so as to cover the metal foil. Then, by exposing and developing the resist, a resist film (not illustrated in FIG. 8) is formed on the metal foil of a portion corresponding to a forming area of the wiring patterns 104. After that, the metal foil is etched by using the resist film as a mask so that the wiring patterns 104 are formed (subtractive method). Then, the resist film is removed.

Next, in a step illustrated in FIG. 9, the solder resist 106 is formed on the insulation layer 103 so as to cover the wiring patterns 104 situated at a portion other than the external connecting terminal providing areas 104A. Next, in a step illustrated in FIG. 10, the semiconductor substrate 110 is ground from a rear surface side of the semiconductor substrate 110 so that the thin plate-shaped configuration of the semiconductor substrate 110 is made. Next, in a step illustrated in FIG. 11, the external connecting terminals 107 are formed on the external connecting terminal providing areas 104A. Solder bumps, for example, can be used as the external connecting terminals 107. As materials of the external connecting terminals 107, for example, an alloy including Pb, an alloy of Sn and Cu, an alloy of Sn and Ag, an alloy of Sn, Ag, and Cu, and other metals and alloys can be used. After that, parts of the semiconductor substrate 110 are cut at the cutting positions C so that plural semiconductor devices 100 are manufactured.

Thus, according to the related art semiconductor device (chip size package), since the external connecting terminals should be formed on the chip size package, only a so-called a fan-in structure should be applied. See, for example, Japanese Patent Application Publication No. 2001-298149 and Japanese Patent Application Publication No. 2001-217381.

However, as a large number of pins are provided in the semiconductor device, it may become more difficult to arrange re-wirings and therefore a so-called fan-out structure may be required.

SUMMARY OF THE INVENTION

Accordingly, embodiments of the present invention may provide a novel and useful manufacturing method of a semiconductor device solving one or more of the problems discussed above.

More specifically, the embodiments of the present invention may provide a manufacturing method of a semiconductor device having the so-called fan-out structure.

Another aspect of the embodiments of the present invention may be to provide a manufacturing method of a semiconductor device, including:

a first step of forming a first electrode pad at an external edge part of a semiconductor chip mounting area of a supporting board, the supporting board having a main surface where the semiconductor chip mounting area is provided;

a second step of fixing a rear surface of a semiconductor chip having a main surface, the main surface where a second electrode pad is formed, to an inside of an area of the main surface of the supporting board, the area where the first electrode pad is formed;

a third step of forming a first internal connecting terminal on the first electrode pad, and forming a second internal connecting terminal on the second electrode pad;

a fourth step of forming a first insulation layer on the main surface of the supporting board so that the semiconductor chip is covered and parts of the first internal connecting terminal and the second internal connecting terminal are exposed;

a fifth step of forming a wiring pattern including a wiring configured to electrically connect the first internal connecting terminal and the second internal connecting terminal to each other, on the first insulation layer; and a sixth step of forming a second insulation layer so that the wiring pattern formed on the first insulation layer is covered, the second insulation layer including an opening part configured to expose an external connecting terminal providing area of the wiring pattern;

wherein, in the sixth step, the opening part is arranged in an area including a portion outside where the second internal connecting terminal is formed.

Additional objects and advantages of the embodiments are set forth in part in the description which follows, and in part will become obvious from the description, or may be learned by practice of the invention. The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 38 is a third view showing the example of the manufacturing process of the semiconductor device of the third embodiment of the present invention.

DETAILED DESCRIPTION OF THE PREFERRED EMBODIMENTS

A description is given below, with reference to the FIG. 12 through FIG. 38 of embodiments of the present invention.

First Embodiment

Figure 1:
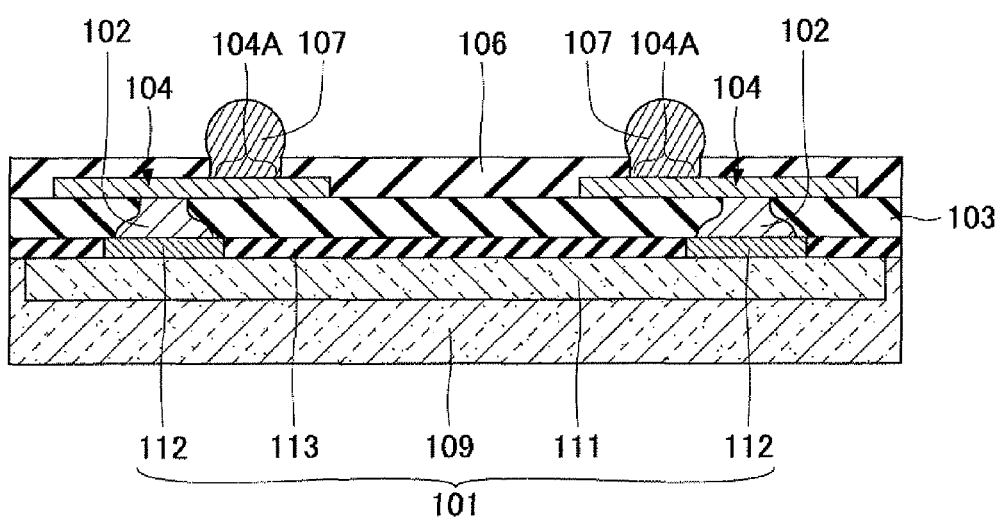
FIG. 1 is a cross-sectional view of an example of a related art semiconductor device.
Figure 2:
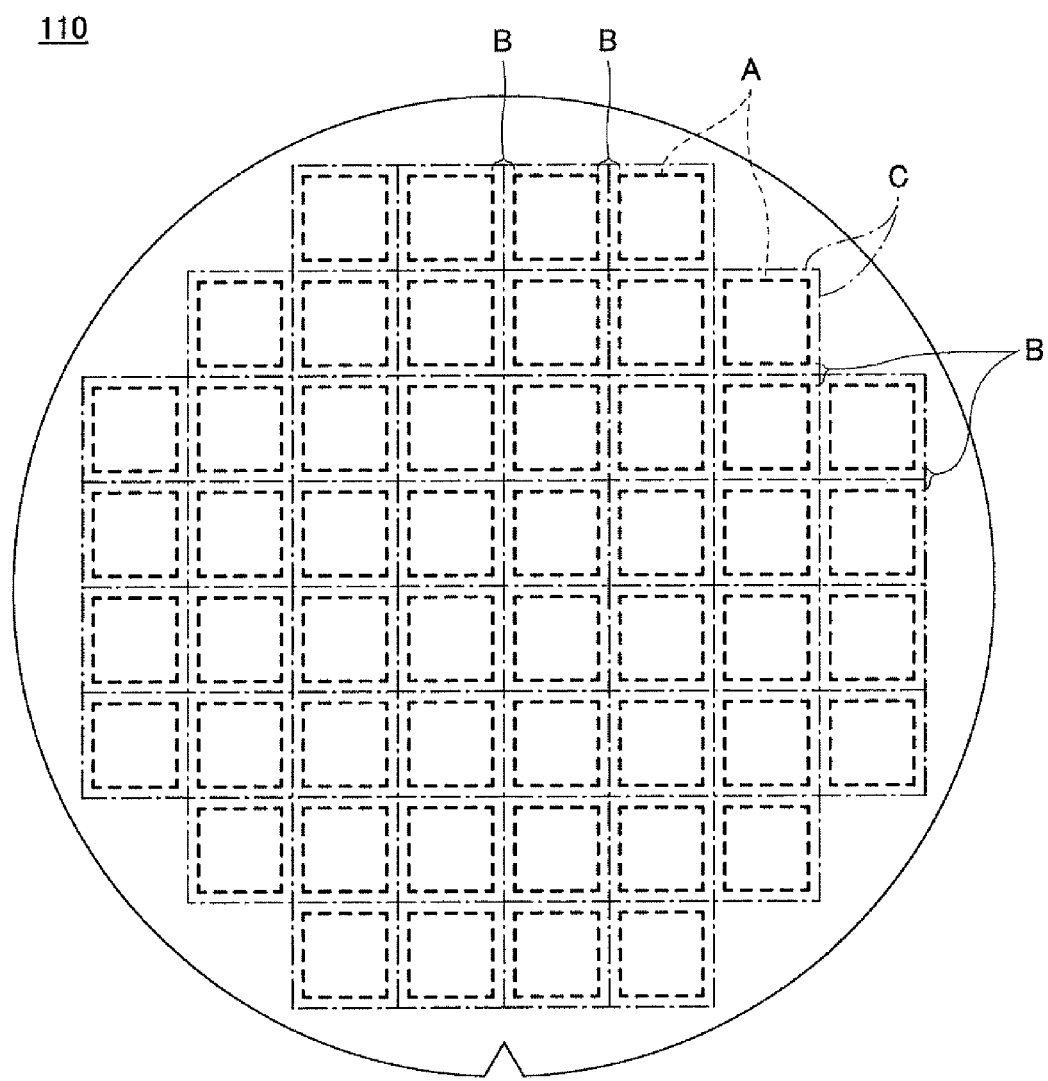
FIG. 2 is a plan view of an example of a semiconductor substrate forming the related art semiconductor device.
Figure 3:
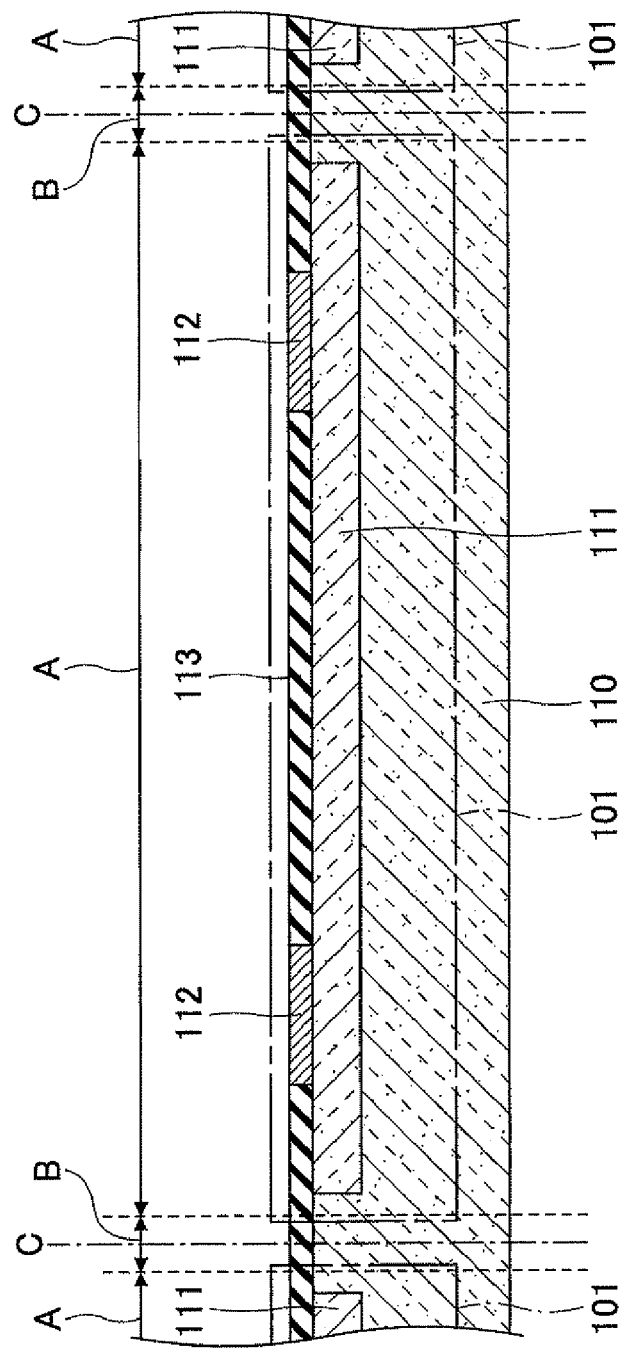
FIG. 3 is a first view showing an example of a manufacturing process of the related art semiconductor device.
Figure 4:
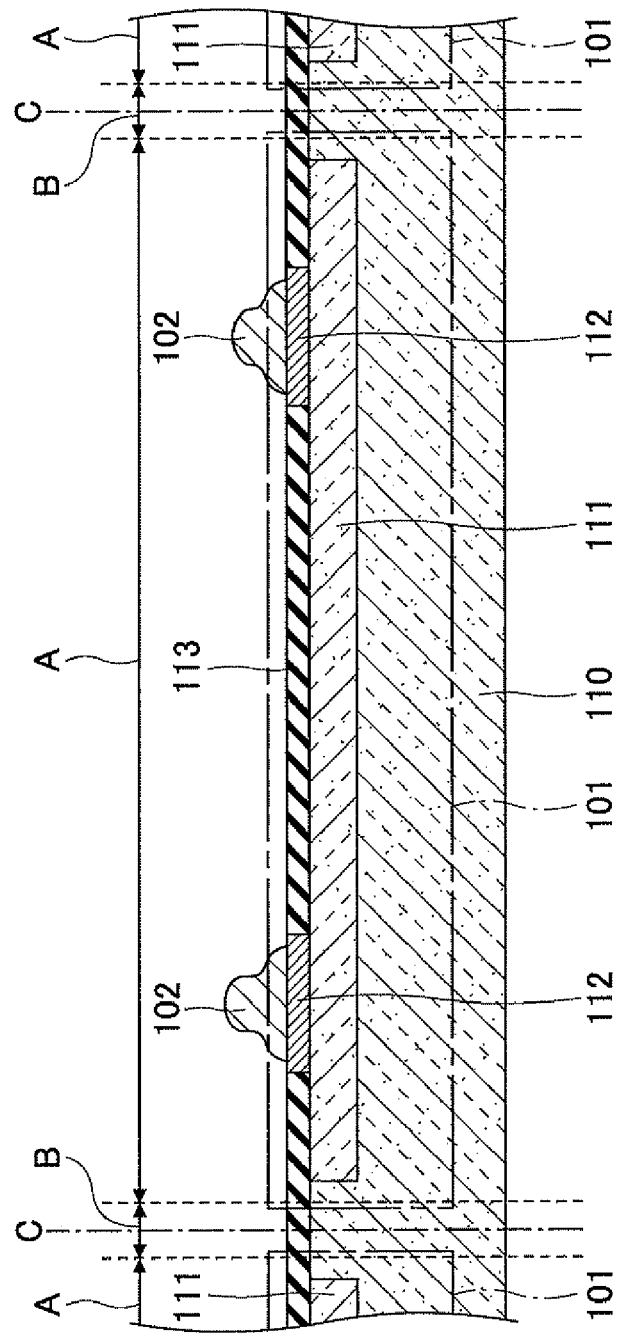
FIG. 4 is a second view showing the example of the manufacturing process of the related art semiconductor device.
Figure 5:
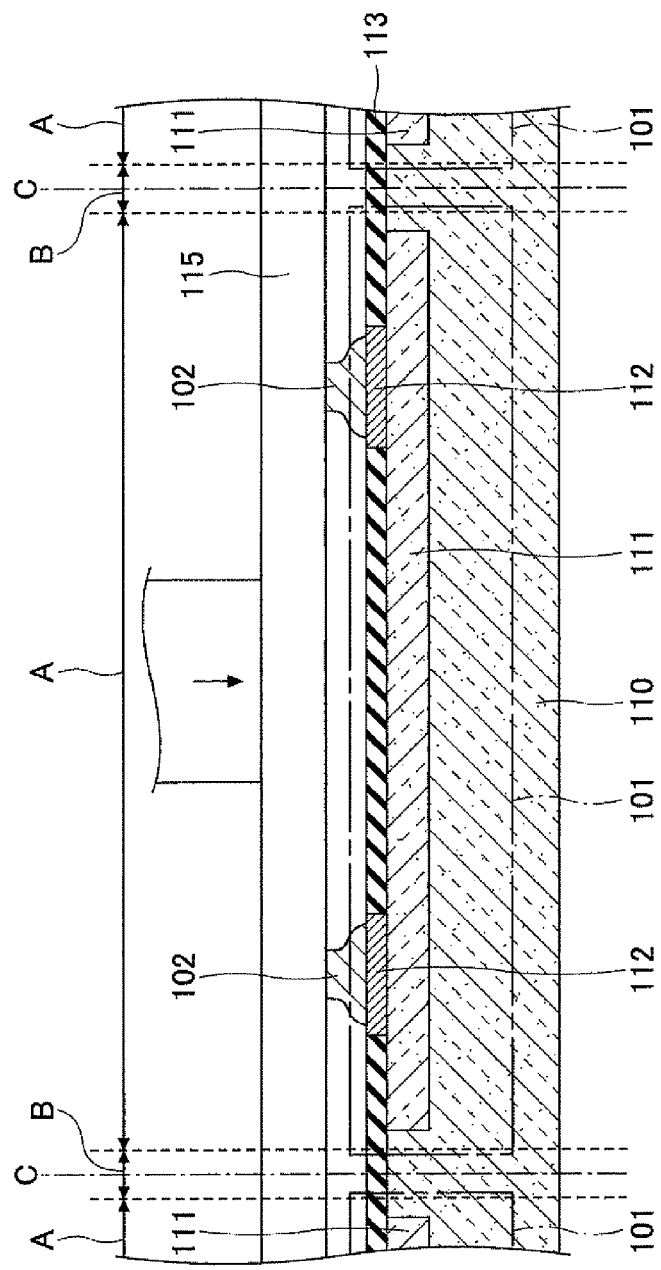
FIG. 5 is a third view showing the example of the manufacturing process of the related art semiconductor device.
Figure 6:
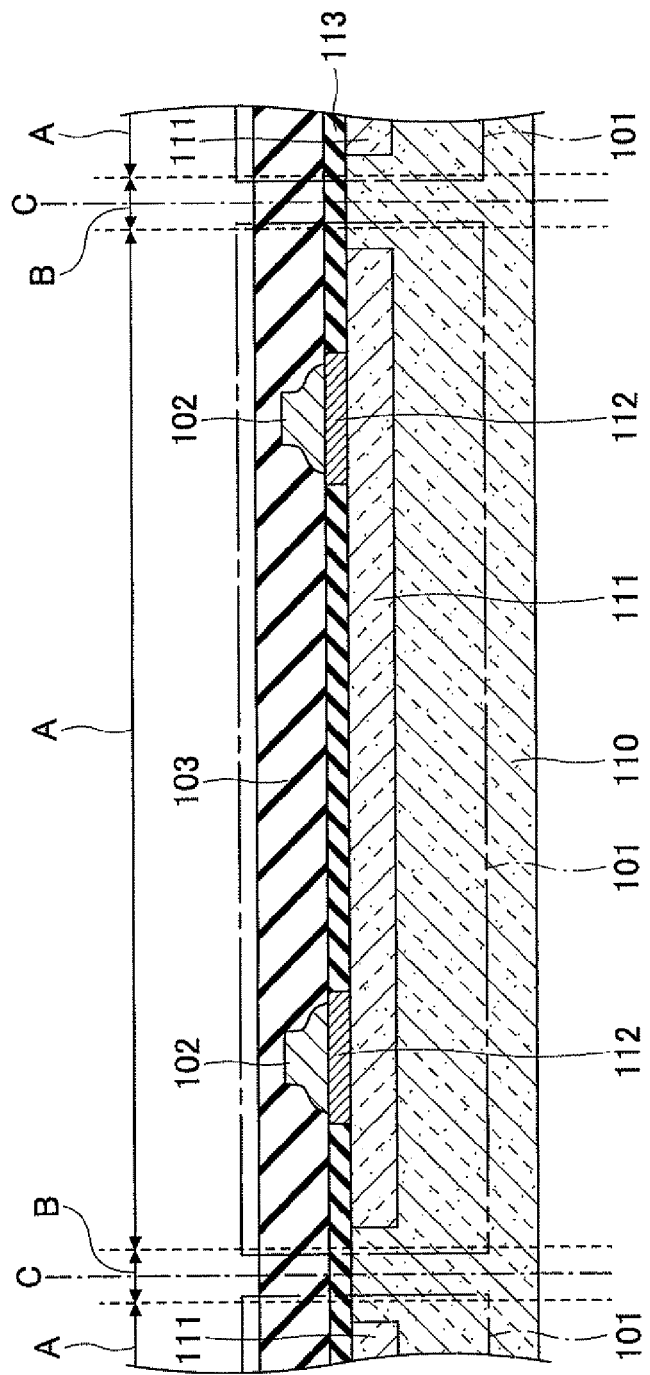
FIG. 6 is a fourth view showing the example of the manufacturing process of the related art semiconductor device.
Figure 7:
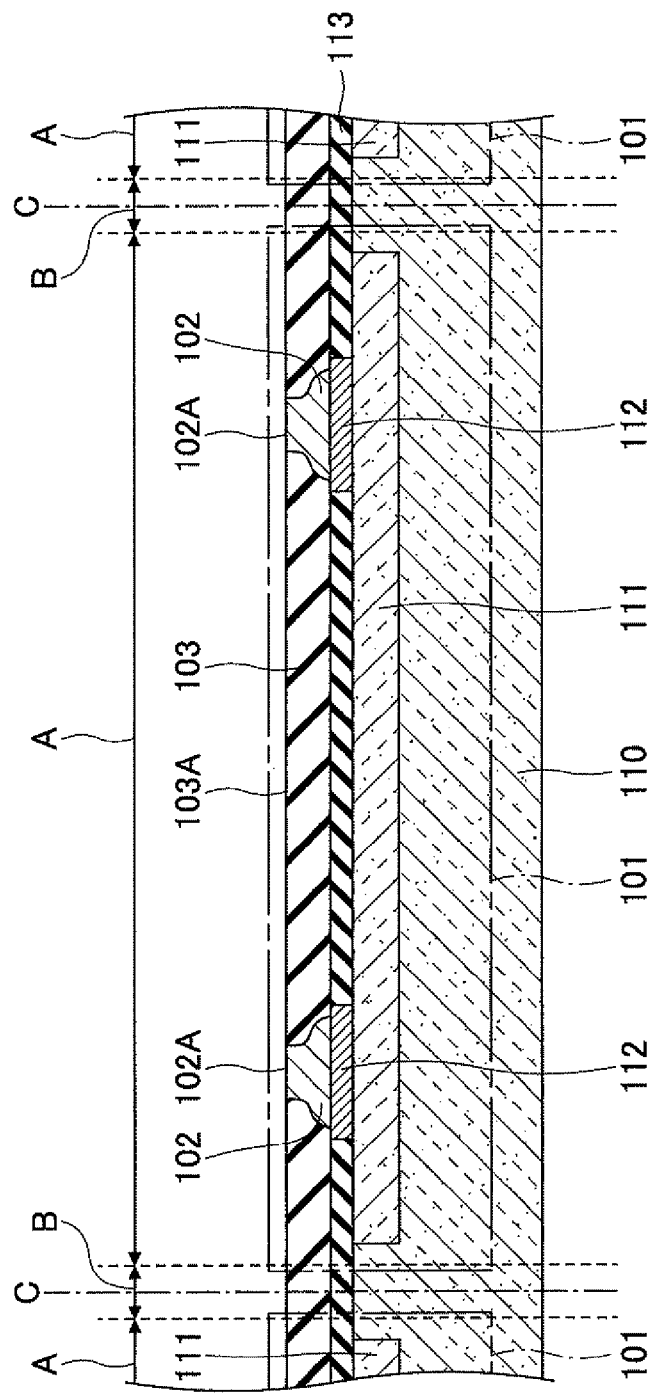
FIG. 7 is a fifth view showing the example of the manufacturing process of the related art semiconductor device.
Figure 8:
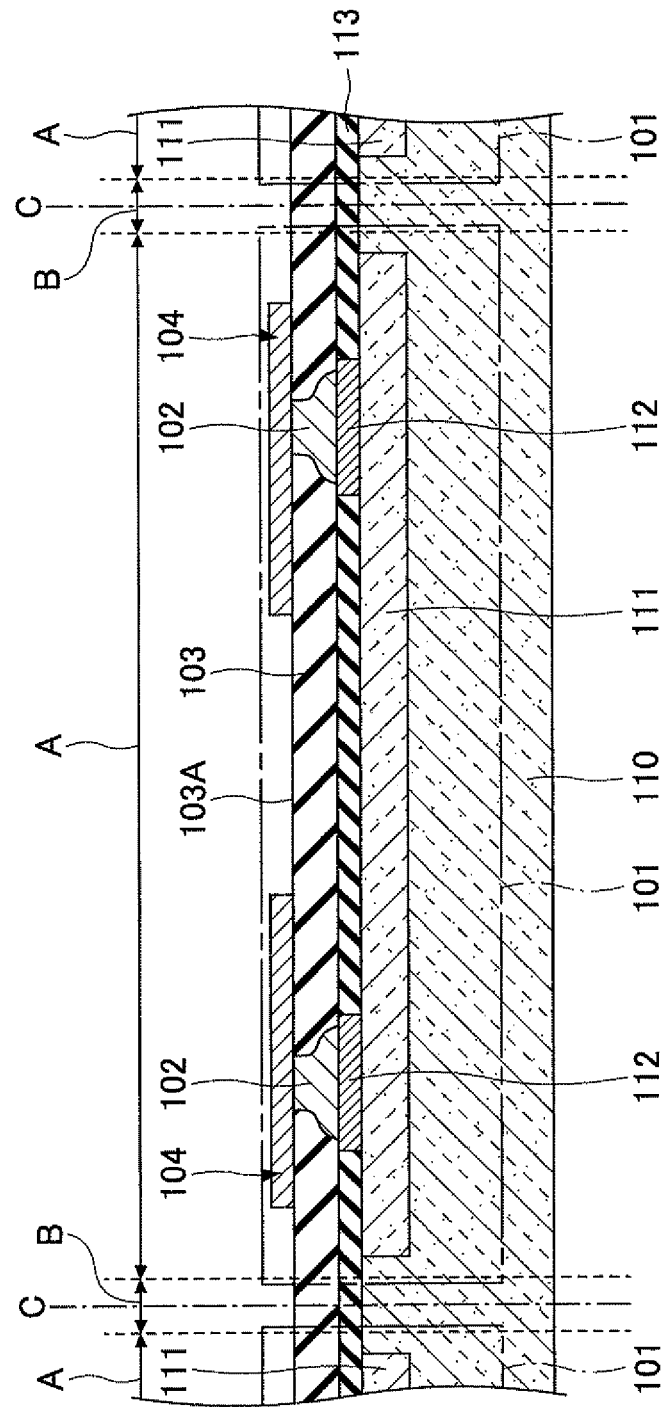
FIG. 8 is a sixth view showing the example of the manufacturing process of the related art semiconductor device.
Figure 9:
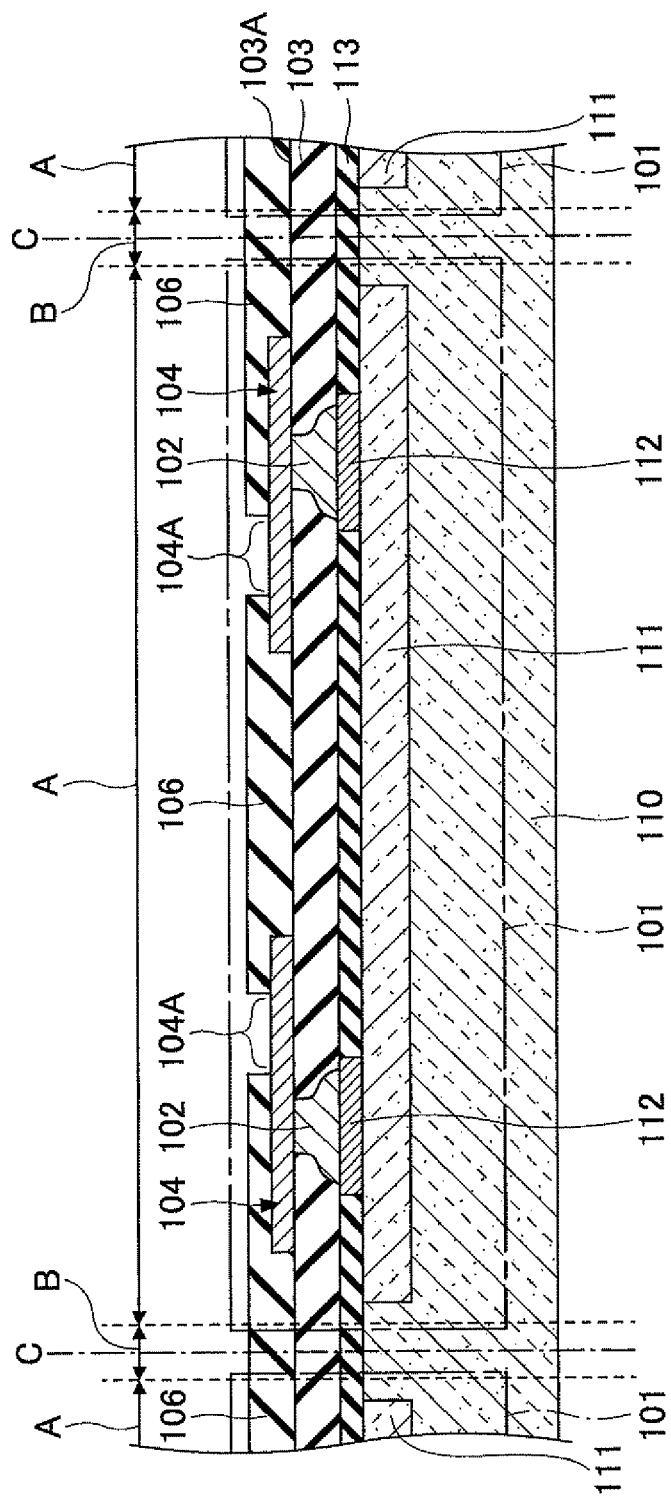
FIG. 9 is a seventh view showing the example of the manufacturing process of the related art semiconductor device.
Figure 10:
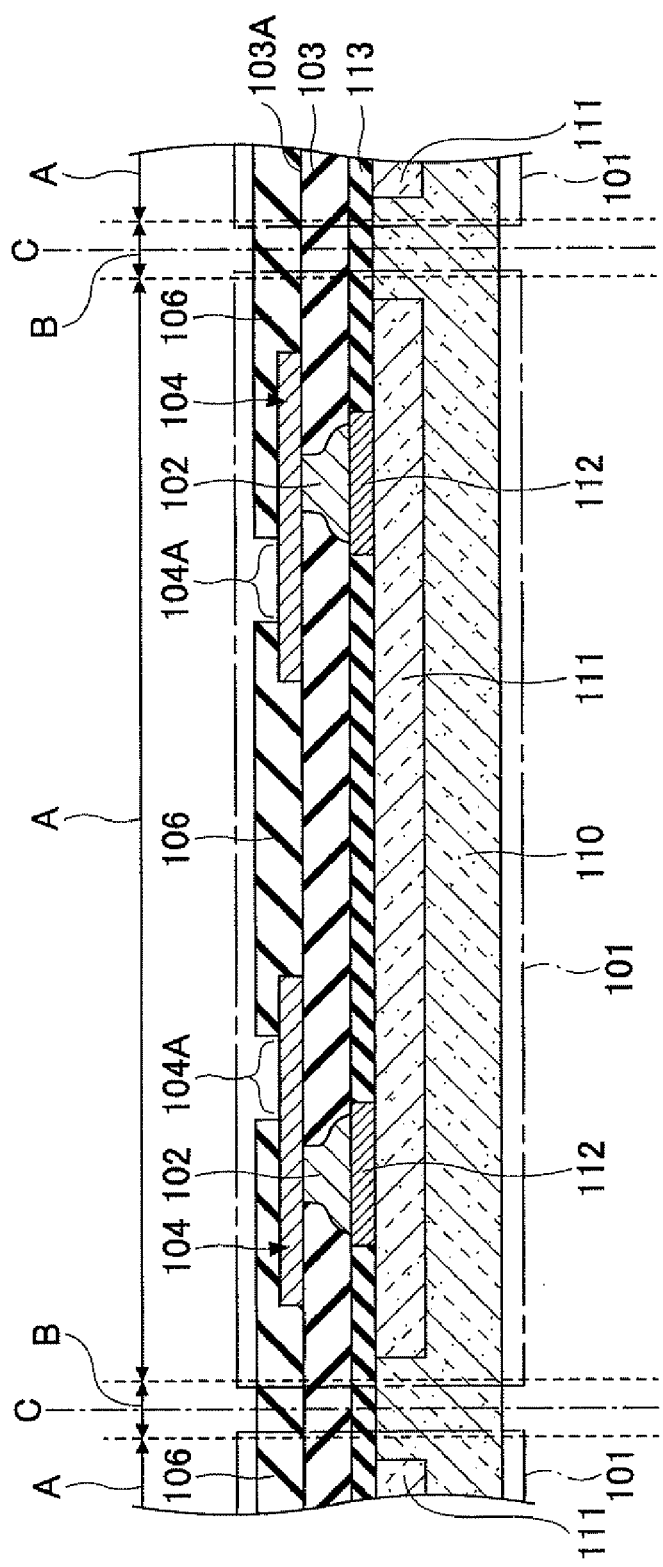
FIG. 10 is an eighth view showing the example of the manufacturing process of the related art semiconductor device.
Figure 11:
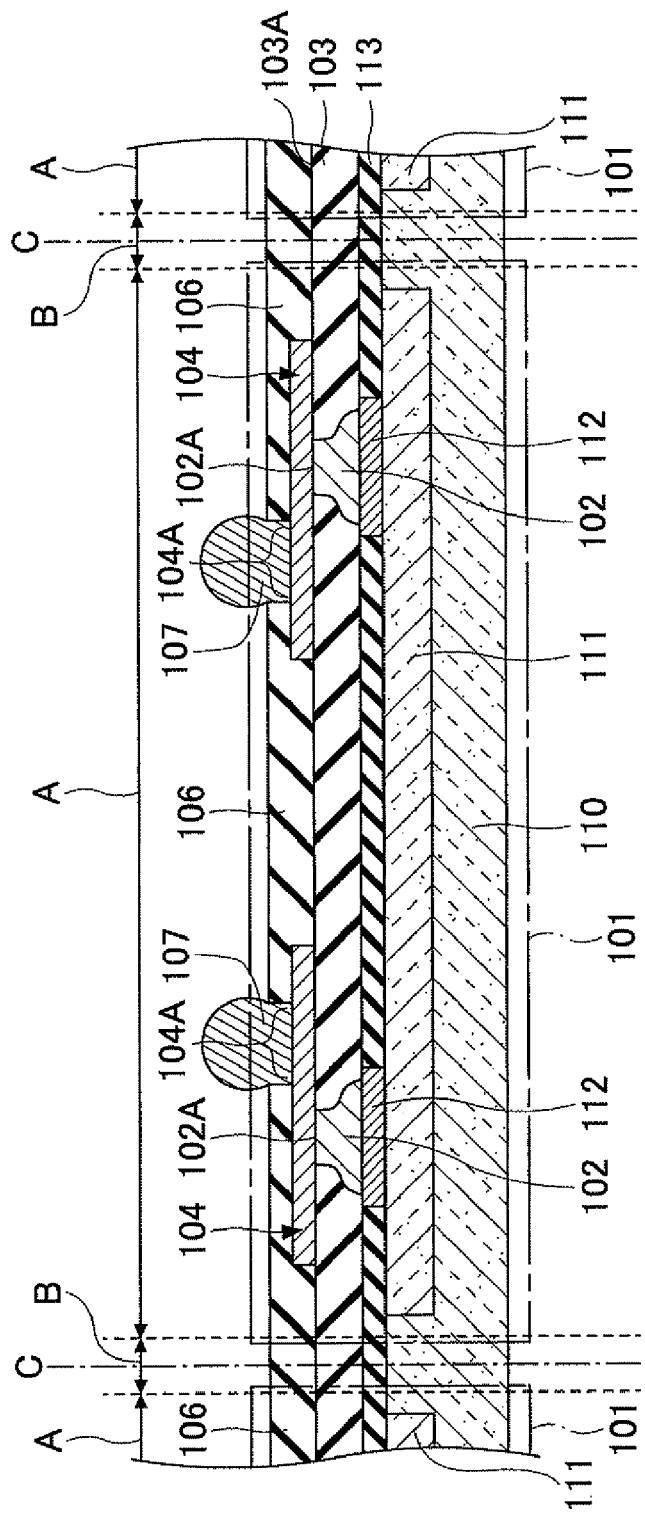
FIG. 11 is a ninth view showing the example of the manufacturing process of the related art semiconductor device.
Figure 12:
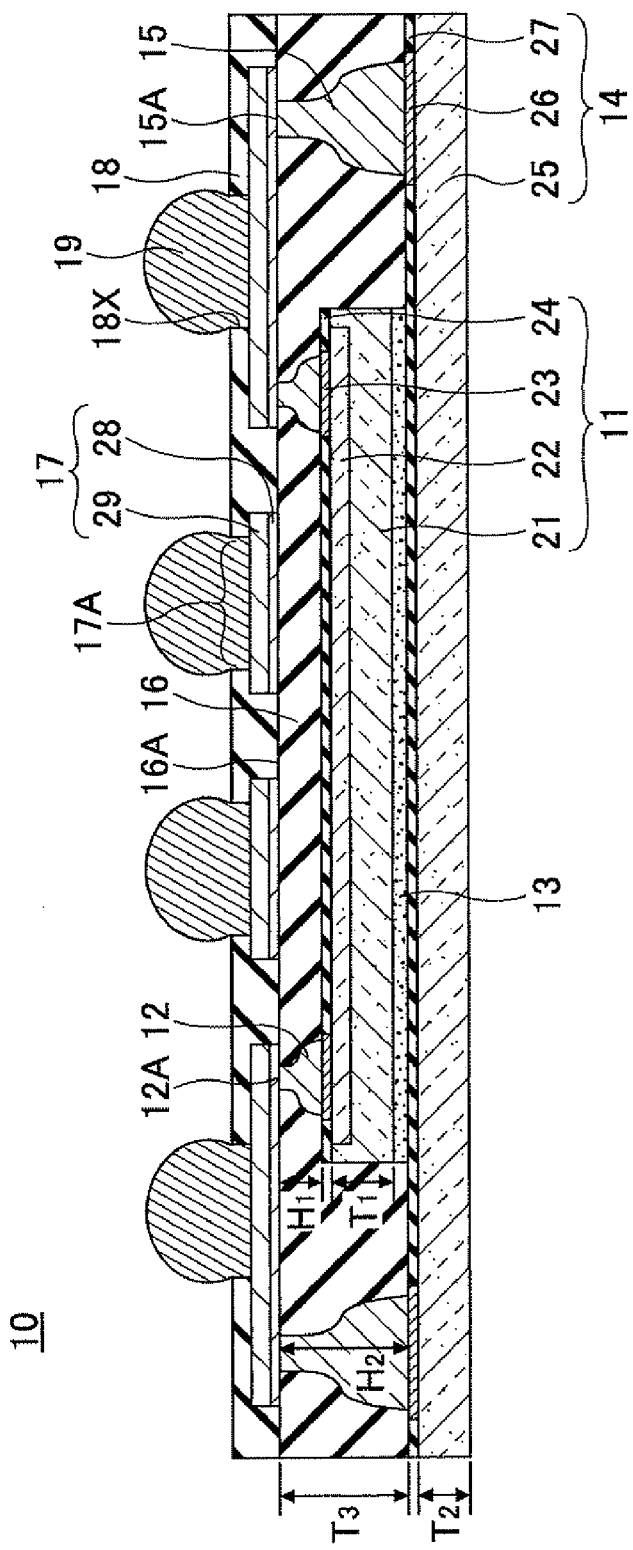
FIG. 12 is a cross-sectional view of an example of a semiconductor device of a first embodiment of the present invention.

FIG. 12 is a cross-sectional view of an example of a semiconductor device of a first embodiment of the present invention. As shown in FIG. 12, a semiconductor device 10 includes a semiconductor chip 11, first internal connecting terminals 15, a fixing layer 13, a supporting board 14, second internal connecting terminals 12, an insulation layer 16, a wiring pattern 17 including a first metal layer 28 and a second metal layer 29, solder resist 18, and external connecting terminals 19.

As shown in FIG. 12, the semiconductor chip 11 is fixed on the supporting board 14 via the fixing layer 13. The semiconductor chip 11 includes a semiconductor substrate 21, a semiconductor integrated circuit 22, plural electrode pads 23, and a protection film 24. The semiconductor integrated circuit 22 is formed at the semiconductor substrate 21. The semiconductor substrate 21 has a thin-plate shape configuration. The thickness $T_1$ of the semiconductor substrate 21 including the thickness of the semiconductor integrated circuit 22 can be, for example, approximately 50 μm through approximately 100 μm. The semiconductor substrate 21 is formed by, for example, cutting the Si wafer having a thin plate shape configuration into pieces.

The semiconductor integrated circuit 22 is provided at a surface of the semiconductor substrate 21. The semiconductor integrated circuit 22 includes a diffusion layer (not illustrated in FIG. 12) formed on the semiconductor substrate 21, an insulation layer (not illustrated in FIG. 12) formed on the semiconductor substrate 21, wiring (not illustrated in FIG. 12) and a via hole (not illustrated in FIG. 12) in stacked insulation layers, and other parts. In the following explanation, a surface where the semiconductor integrated circuit 22 of the semiconductor chip 11 is formed may be called a main surface.

The plural electrode pads 23 are provided on the semiconductor integrated circuit 22. The electrode pads 23 are electrically connected to the wiring (not illustrated in FIG. 12) provided on the semiconductor integrated circuit 22. As a material of the electrode pad 23, for example, Al or the like can be used. As the material of the electrode pad 23, a material where an Al layer is formed on a Cu layer, a material where an Al layer is formed on a Si layer formed on a Cu layer or the like may be used.

The protection film 24 is provided on the surface of the semiconductor substrate 21 and on the semiconductor integrated circuit 22. The protection film 24 is configured to protect the semiconductor integrated circuit 22 and may be called a passivation film. As the protection film 24, for example, an SiN film, a PSG film, or the like can be used. In addition, a polyimide film or the like may be further stacked on the SiN film, the PSG film, or the like.

The second internal connecting terminal 12 is provided on the electrode pad 23 of the semiconductor chip 11. The second internal connecting terminal 12 is configured to electrically connect the semiconductor integrated circuit 22 of the semiconductor chip 11 and the wiring pattern 17 to each other. The height $H_1$ of the second internal connecting terminal 12 can be, for example, approximately 20 μm through approximately 50 μm. A surface of the second internal connecting terminal 12 facing the electrode pad 23 can have, for example, a substantially circular-shaped configuration. A diameter of the substantially circular-shaped configuration may be, for example, approximately 40 μm through approximately 70 μm.

As the second internal connecting terminal 12, for example, an Au bump, a Cu bump, an Au plating film, a metal film formed of a Ni film formed by an electroless plating method and an Au film covering the Ni film, or the like can be used. The Au bump or the Cu bump can be formed by a bonding wire by using, for example, a wire bonding apparatus. In addition, the Au bump or the Cu bump can be fowled by using a plating method.

The fixing layer 13 is provided so as to fix the semiconductor chip 11 and the supporting board 14 to each other.

As long as the semiconductor chip 11 and the supporting board 14 can be fixed to each other, any material can be used as a material of the fixing layer 13. As the material of the fixing layer 13, for example, a double-faced pressure-sensitive adhesive tape such as a die attach film can be used. In addition, instead of the double-faced pressure-sensitive adhesive tape such as the die attaché film, an adhesive or the like having electrical insulation may be used. The thickness of the fixing layer 13 can be, for example, approximately 10 μm.

The supporting board 14 includes a semiconductor substrate 25, an electrode pad 26, and a protection film 27. The semiconductor substrate 25 has a thin-plate-shaped configuration. The thickness $T_2$ of the semiconductor substrate 25 can be, for example, approximately 200 μm through approximately 500 μm. The semiconductor substrate 25 is formed by, for example, cutting the Si wafer having a thin plate-shaped configuration into pieces. In the following explanation, a surface at an electrode pad 26 side of the supporting board 14 may be called a main surface. The semiconductor substrate 25 of the supporting board 14 may have a semiconductor integrated circuit.

The first internal connecting terminal 15 is provided on the electrode pad 26 of the supporting board 14. The first internal connecting terminal 15 is provided so as to form the so-called fan-out structure so that the external connecting terminal 19 is provided outside the semiconductor chip 11 as shown in FIG. 12. The height $H_2$ of the first internal connecting terminal 15 can be, for example, approximately 80 μm through approximately 160 μm. A surface of the first internal connecting terminal 15 facing the electrode pad 26 can have, for example, a substantially circular-shaped configuration. A diameter of the substantially circular-shaped configuration may be, for example, approximately 100 μm through approximately 150 μm.

As the first internal connecting terminal 15, for example, an Au bump, a Cu bump, an Au plating film, a metal film formed by a Ni film formed by an electroless plating method and an Au film covering the Ni film, or the like can be used. The Au bump or the Cu bump can be formed by a bonding wire by using, for example, a wire bonding apparatus. In addition, the Au bump or the Cu bump can be formed by using a plating method.

As the second internal connecting terminal 12, for example, an Au bump, a Cu bump, an Au plating film, a metal film formed by a Ni film formed by an electroless plating method and an Au film covering the Ni film, or the like can be used. The Au bump or the Cu bump can be formed by a bonding wire by using, for example, a wire bonding apparatus. In addition, the Au bump or the Cu bump can be formed by using a plating method.

The insulation layer 16 is formed on the supporting board 14 so as to cover the semiconductor chip 11, the first internal connecting terminal 15, and the second internal connecting terminal 12. A surface 15A of the first internal connecting terminal 15 and a surface 12A of the second internal connecting terminal 12 are exposed from (through) a surface 16A of the insulation layer 16. The surface 16A of the insulation layer 16 is flush with a surface 15A of the first internal connecting terminal 15 and a surface 12A of the second internal connecting terminal 12. The insulation layer 16 is configured to protect the main surface (circuit forming surface) of the semiconductor chip 11 by sealing and is a base member when the wiring pattern is formed. The thickness $T_3$ of the insulation layer 16 can be, for example, approximately 80 μm through approximately 160 μm.

As a material of the insulation layer 16, for example, insulation resin such as epoxy group resin or polyimide group resin, a built-up resin such as epoxy resin including inorganic filler or epoxy resin excluding the inorganic filler, a liquid crystal polymer, or the like can be used.

The first internal connecting terminal 15 and the second internal connecting terminal 12 are covered with only the insulation layer 16. With this structure, it is possible to prevent a partial stress from being applied to the first internal connecting terminal 15 and the second internal connecting terminal 12. Hence, it is possible to prevent cracks from being generated at the first internal connecting terminal 15 and the second internal connecting terminal 12. In other words, if the first internal connecting terminal 15 and the second internal connecting terminal 12 come in contact with plural insulation layers, based on differences of physical properties (coefficient of thermal expansion, modulus of elasticity, or the like) of the plural insulation layers, the partial stress may be applied, due to temperature change or the like, to a portion where the first internal connecting terminal 15 and the second internal connecting terminal 12 come in contact with plural insulation layers. As a result of this, the cracks may be generated at the first internal connecting terminal 15 and the second internal connecting terminal 12. By forming a structure where the first internal connecting terminal 15 and the second internal connecting terminal 12 come in contact with a single insulation layer 16, it is possible to prevent cracks from being generated at the first internal connecting terminal 15 and the second internal connecting terminal 12.

The wiring patterns 17, which may be the so-called re-wirings, are provided so that positions of the electrode pads 23 are different from a position of the external connecting terminals 19. In other words, the so-called fan-out structure is formed. The wiring pattern 17 includes the first metal layer 28 and the second metal layer 29. As the first metal layer 28, a layered product where, for example, a Ti film and a Cu film are stacked in this order, a layered product where a Cr film and a Cu film are stacked in this order, a single layer structural body of a Cu film, or the like can be used. As a material of the second metal layer 29, for example, Cu or the like can be used.

The wiring pattern 17 is provided on the surface 16A of the insulation layer 16. A part of the wiring pattern 17 comes in contact with the surface 15A of the first internal connecting terminal 15 and the surface 12A of the second internal connecting terminal 12 so as to contribute to realization of the so-called fan-out structure. The wiring pattern 17 is electrically connected to the semiconductor integrated circuit 22 via the first internal connecting terminal 15. The wiring pattern 17 includes an external connecting terminal providing area 17A where the external connecting terminal 19 is provided. The thickness of the wiring pattern 17 can be, for example, approximately 5 μm through approximately 20 μm.

The solder resist layer 18 is provided so as to cover the wiring pattern 17. The solder resist layer 18 includes an opening part 18X configured to expose the external connecting terminal providing area 17A (SMD and NSMD is available). As a material of the solder resist layer 18, resin whose main ingredient is, for example, epoxy, epoxy acrylate, cyanate ester, or siloxane, can be used.

The external connecting terminal 19 is provided on the external connecting terminal providing area 17A of the wiring pattern 17. The external connecting terminal 19 is electrically connected to a pad provided on a mounting board (not illustrated in FIG. 12) such as a motherboard. As the external connecting terminal 19, for example, a solder bump or the like can be used. As materials of the external connecting terminals 19, for example, an alloy including Pb, an alloy of Sn and Cu, an alloy of Sn and Ag, an alloy of Sn, Ag, and Cu, and other metals and alloys can be used. In addition, a solder ball (Sn-3.5 Ag) having a core made of resin such as divinylbenzene may be used for the external connecting terminal 19.

Although the external connecting terminal 19 is formed in this embodiment, it is not always necessary to form the external connecting terminal 19. In other words, it is sufficient to expose the external connecting terminal providing area 17A so that the external connecting terminal 19 may be formed if necessary.

Figure 13:
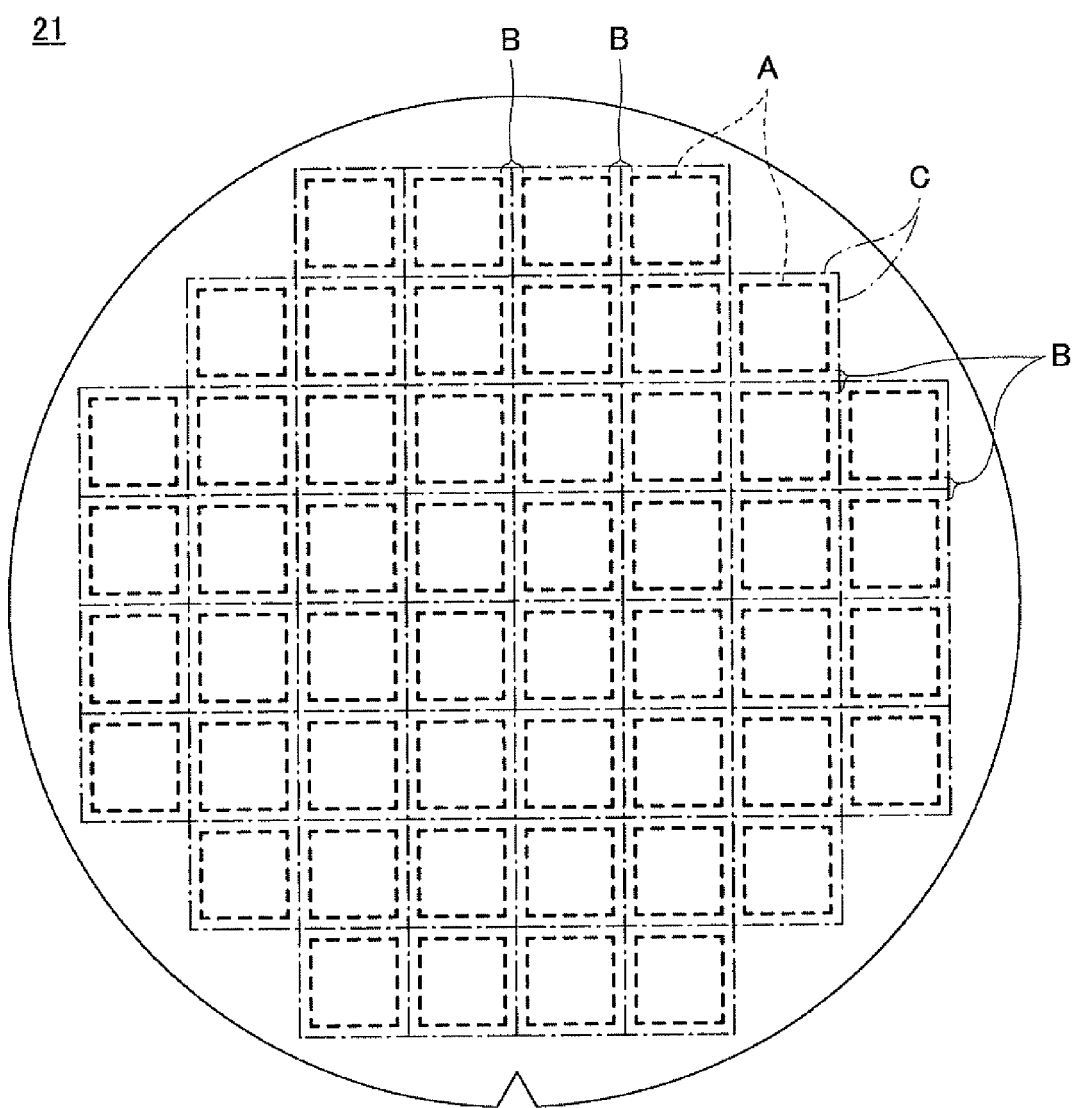
FIG. 13 is a first view showing an example of a manufacturing process of the semiconductor device of the first embodiment of the present invention.
Figure 14:
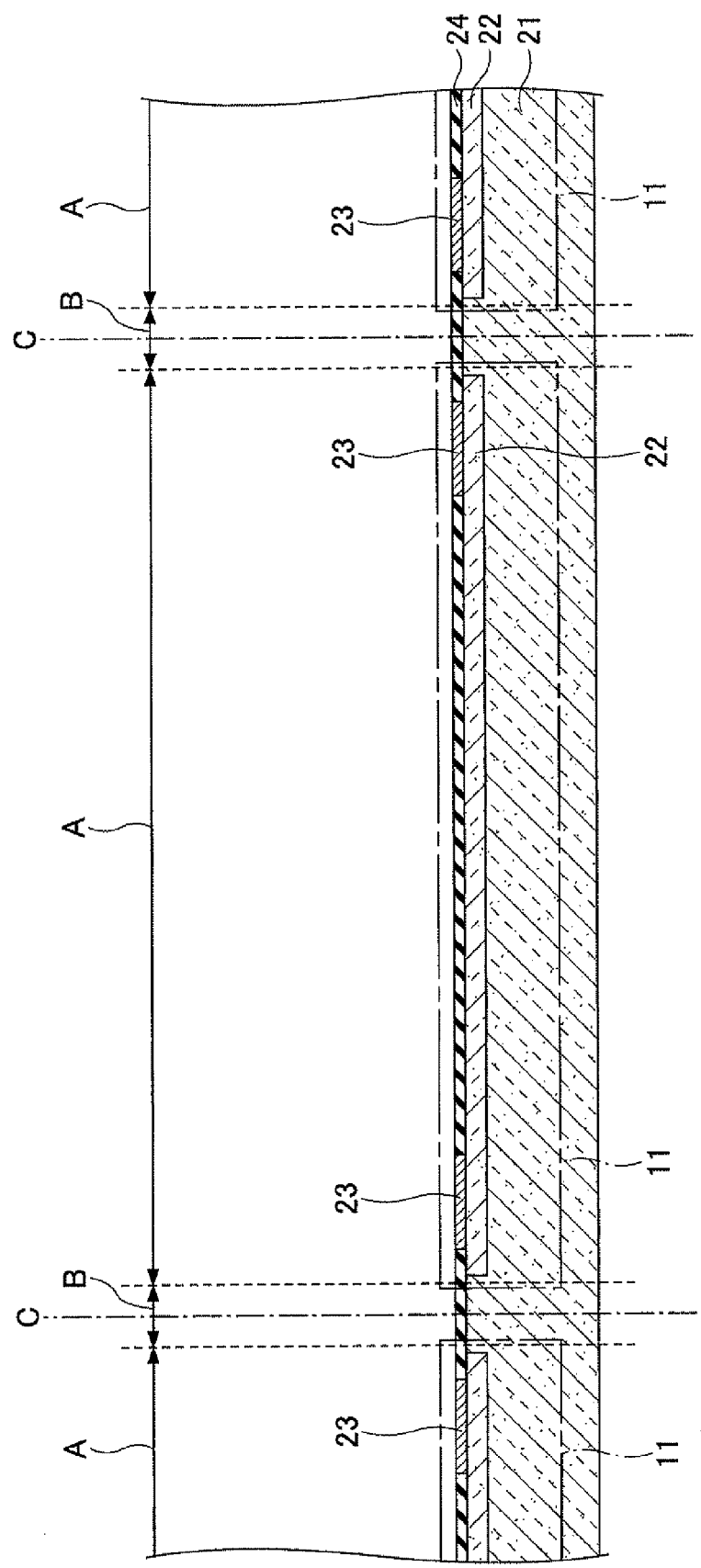
FIG. 14 is a second view showing the example of the manufacturing process of the semiconductor device of the first embodiment of the present invention.
Figure 15:
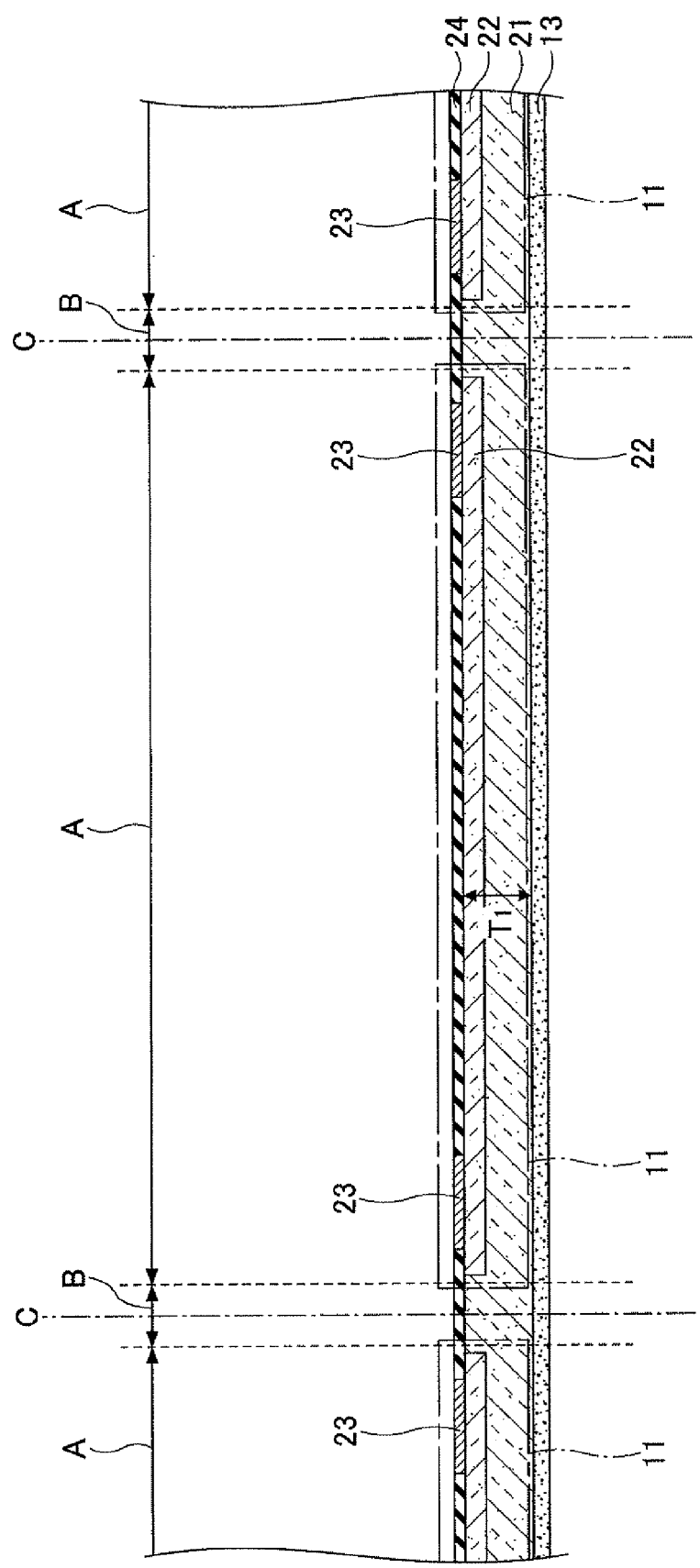
FIG. 15 is a third view showing the example of the manufacturing process of the semiconductor device of the first embodiment of the present invention.

FIG. 13 through FIG. 28 are views showing an example of a manufacturing process of the semiconductor device of the first embodiment of the present invention. In FIG. 13 through FIG. 28, parts that are the same as the parts of the semiconductor device 10 illustrated in FIG. 12 are given the same reference numerals, and explanation thereof may be omitted. In FIG. 13 through FIG. 15, "C" denotes a position (hereinafter "substrate cutting position C") where the semiconductor substrate 21 is cut by a dicing blade. "A" denotes a semiconductor device forming area (hereinafter "semiconductor device forming area A"). "B" denotes a scribing area B, including the substrate cutting position C, where the semiconductor device forming areas A are separated from each other (hereinafter "scribing area B").

Furthermore, in FIG. 17 through FIG. 28, "F" denotes a position (hereinafter "substrate cutting position F") where the semiconductor substrate 25 is cut by a dicing blade. "D" denotes plural semiconductor chip mounting areas (hereinafter "semiconductor chip mounting areas D"). "E" denotes a scribing area E, including the substrate cutting position F, where the semiconductor chip mounting areas D are separated from each other (hereinafter "scribing area E").

First, in a step illustrated in FIG. 13, the semiconductor substrate 21 is prepared. The semiconductor substrate 21 includes plural semiconductor device forming areas A and the scribing areas B including the substrate cutting positions C whereby plural semiconductor device forming areas A are separated from each other. As the semiconductor substrate 21, for example, an Si wafer or the like can be used. The thickness of the semiconductor substrate 21 can be, for example, approximately 500 μm through approximately 775 μm.

Next, in a step illustrated in FIG. 14, by a known method, plural semiconductor chips 11 are formed at a surface of the semiconductor substrate 21 corresponding to the semiconductor device forming area A. The semiconductor chips 11 include the semiconductor integrated circuits 22, the electrode pads 23, and the protection films 24. As a material of the electrode pad 23, for example, Al or the like can be used. As the material of the electrode pad 23, a material where an Al layer is formed on a Cu layer, a material where an Al layer is formed on a Si layer formed on a Cu layer or the like may be used. As the protection film 24, for example, an SiN film, a PSG film, or the like can be used. In addition, a polyimide film or the like may be further stacked on the SiN film, the PSG film, or the like.

Next, in a step illustrated in FIG. 15, the semiconductor substrate 21 is ground from the rear surface side of the semiconductor substrate 21 so that the semiconductor substrate 21 has a thin plate-shaped configuration. In addition, the fixing layer 13 is formed on the rear surface of the thin plate-shaped semiconductor substrate 21. A back side grinder, for example, can be used for making the thin plate-shaped configuration of the semiconductor substrate 21. The thickness $T_1$ of the thinned semiconductor substrate 21 can be, for example, approximately 50 μm through approximately 100 μm. As the material of the fixing layer 13, for example, a double-faced pressure-sensitive adhesive tape such as a die attaché film can be used. In addition, instead of the double-faced pressure-sensitive adhesive tape such as the die attaché film, an adhesive or the like having electrical insulation may be used. The thickness of the fixing layer 13 can be, for example, approximately 10 μm.

Figure 16:
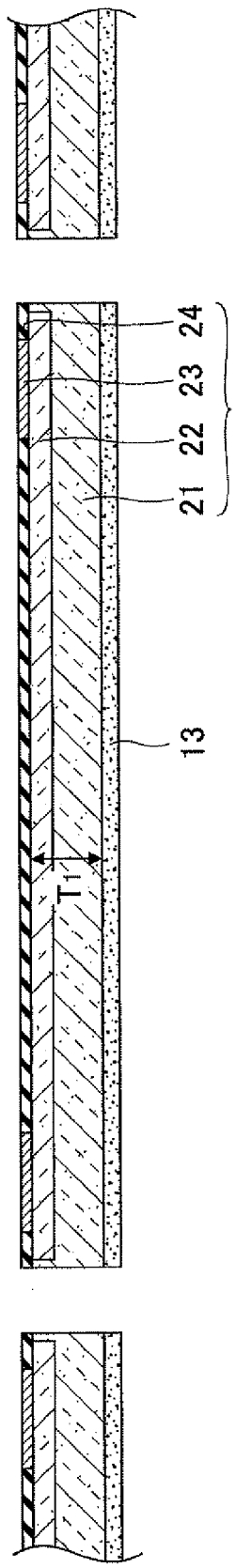
FIG. 16 is a fourth view showing the example of the manufacturing process of the semiconductor device of the first embodiment of the present invention.

Next, in a step illustrated in FIG. 16, the protection film 24 and the semiconductor substrate 21 at a portion corresponding to the scribing area B illustrated in FIG. 15 is cut along the substrate cutting position, so that plural pieces of the semiconductor chips 11 are made. The protection film 24 and the semiconductor substrate 21 can be cut by a blade dicing method or the like using, for example, a dicing blade whose width is less than the width of the scribing area B. In the pieces of the semiconductor chips 11, the fixing layer 13 is formed on the rear surface of the semiconductor substrate 21.

Figure 17:
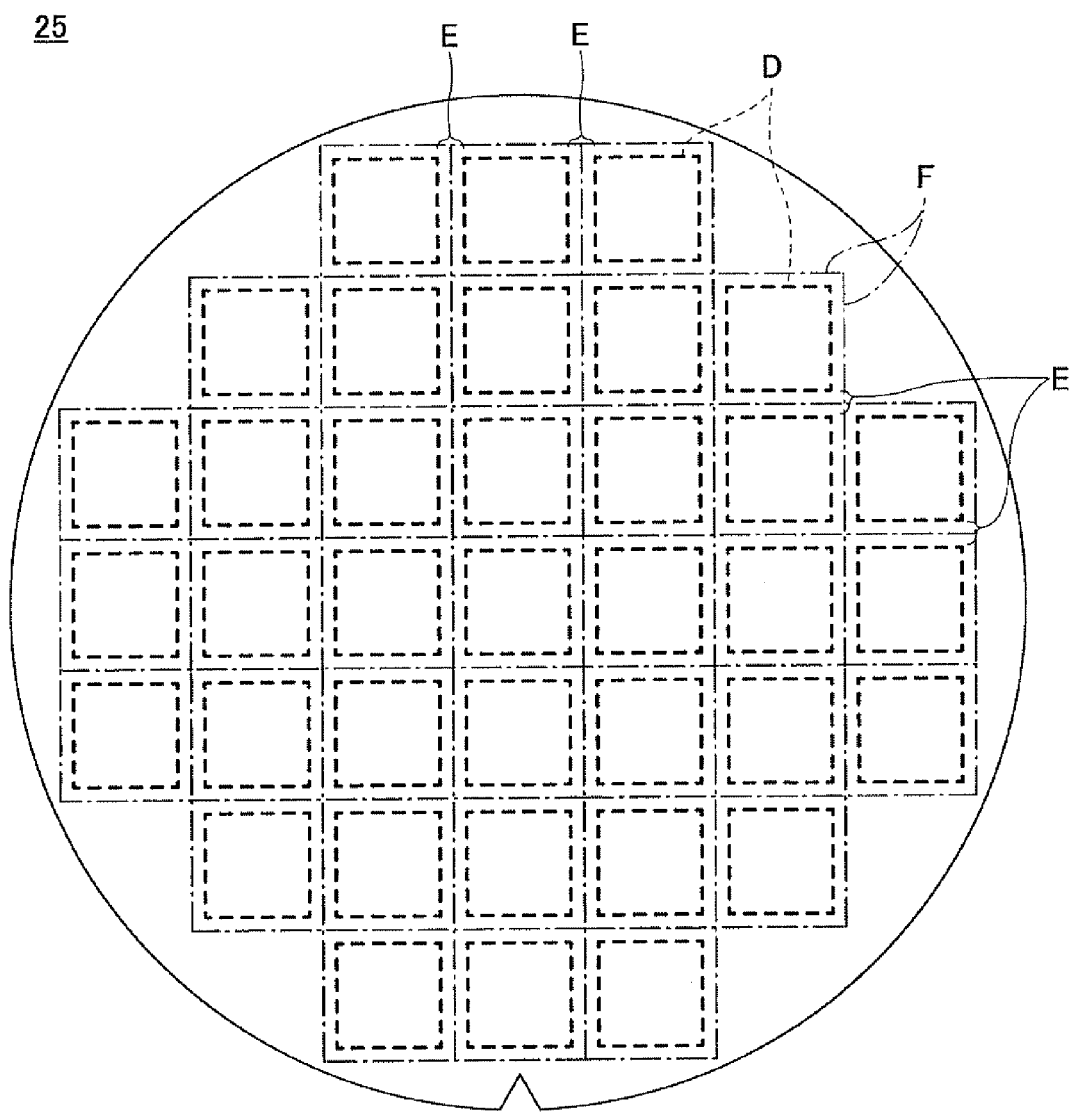
FIG. 17 is a fifth view showing the example of the manufacturing process of the semiconductor device of the first embodiment of the present invention.

Next, in a step illustrated in FIG. 17, the semiconductor substrate 25 is prepared. The semiconductor substrate 25 includes plural semiconductor chip mounting areas D and the scribing areas E including the substrate cutting positions F where plural semiconductor chip mounting areas D are separated from each other. The semiconductor chip mounting area D is an area where the semiconductor chip 11 (see FIG. 16) is mounted. Accordingly, an area in the plan view of FIG. 17 of the semiconductor chip mounting area D is larger than an area in plan view of the semiconductor chip 11. As the semiconductor substrate 25, for example, an Si wafer or the like can be used. The thickness of the semiconductor substrate 25 can be, for example, approximately 500 μm through approximately 775 μm.

Figure 18:
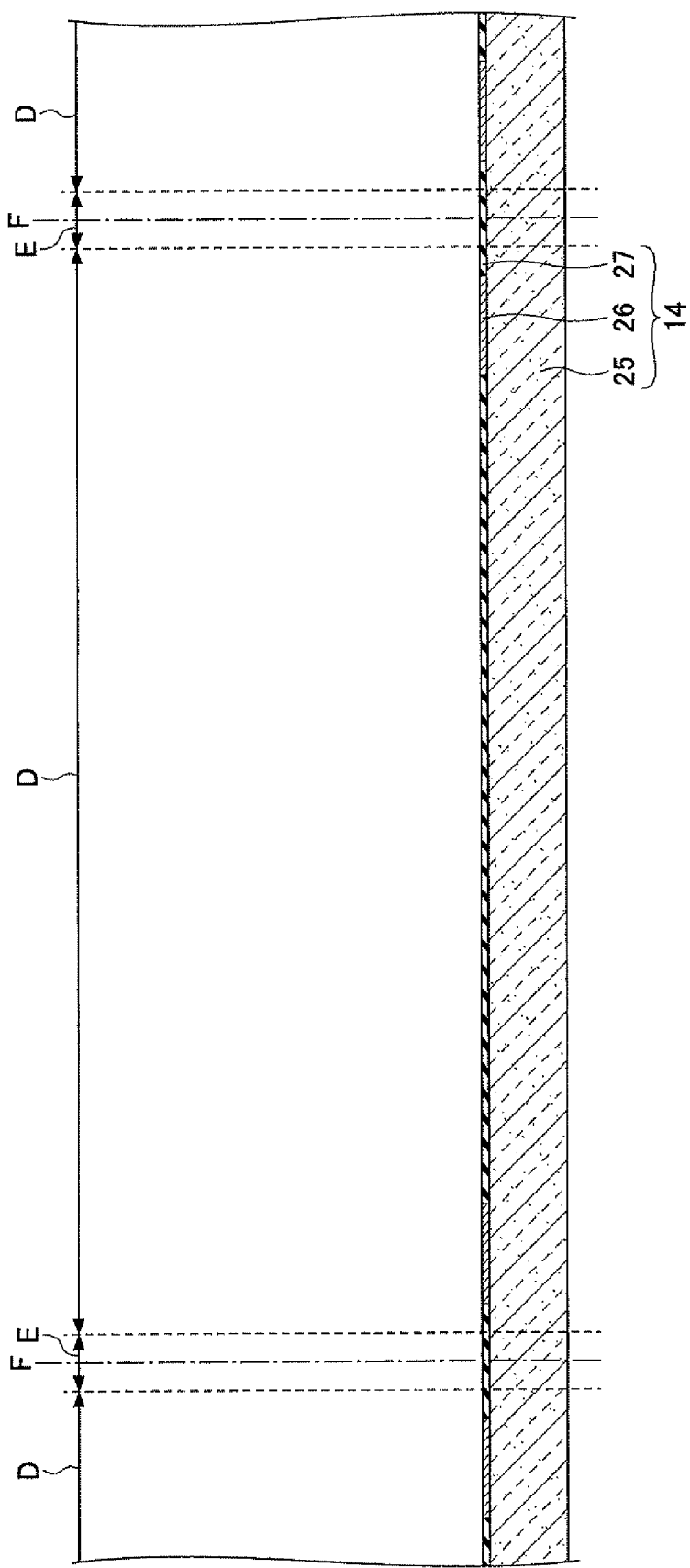
FIG. 18 is a sixth view showing the example of the manufacturing process of the semiconductor device of the first embodiment of the present invention.

Next, in a step illustrated in FIG. 18, by a known method, the electrode pad 26 and the protection film 27 are formed at the surface of the semiconductor substrate 25 corresponding to the semiconductor chip mounting area D so that the supporting board 14 is manufactured. As a material of the electrode pad 26, for example, Al or the like can be used. As the material of the electrode pad 26, a material where an Al layer is formed on a Cu layer, a material where an Al layer is formed on a Si layer formed on a Cu layer or the like may be used. As the protection film 27, for example, an SiN film, a PSG film, or the like can be used. In addition, a polyimide film or the like may be further stacked on the SiN film, the PSG film, or the like. In this step, the semiconductor integrated circuit may be formed on the semiconductor substrate 25 of the supporting board 14.

Figure 19:
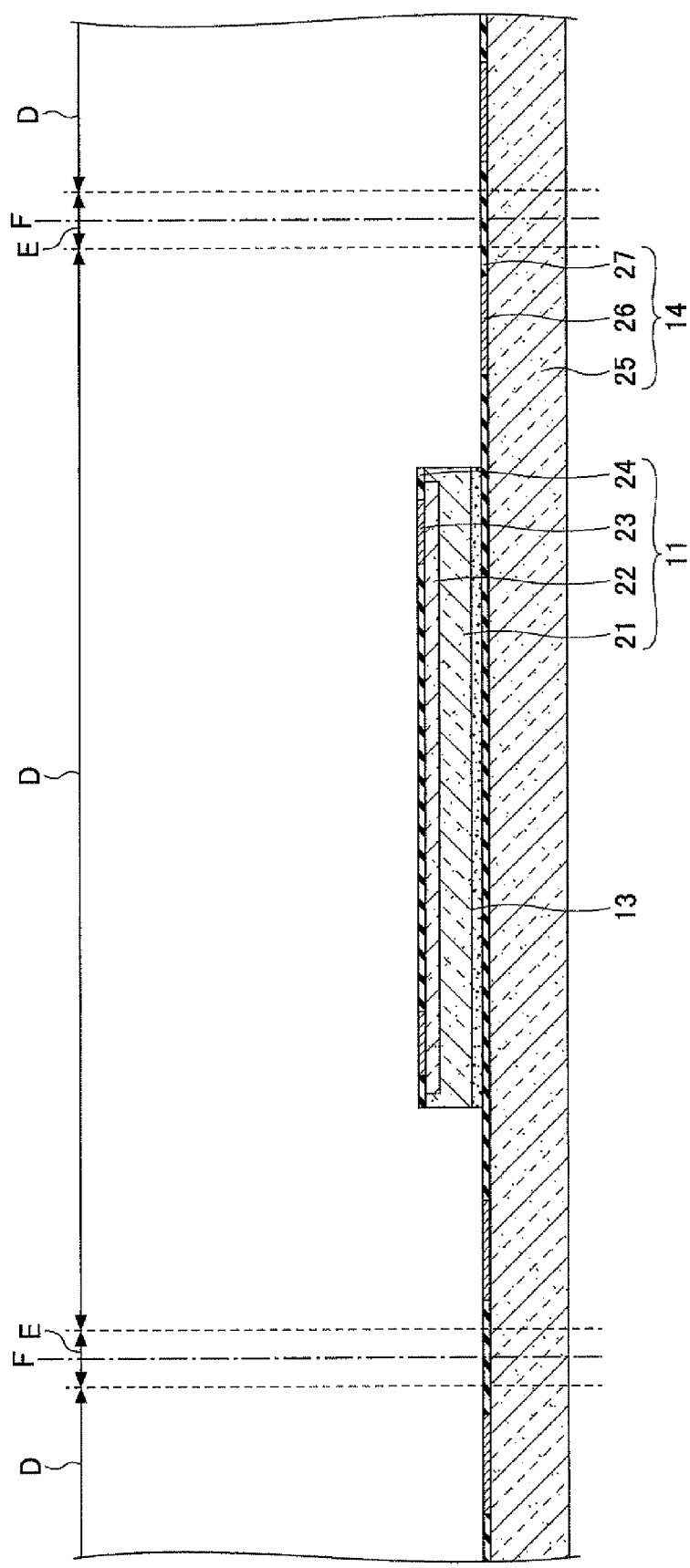
FIG. 19 is a seventh view showing the example of the manufacturing process of the semiconductor device of the first embodiment of the present invention.

Next, in a step illustrated in FIG. 19, one of the semiconductor chips 11 illustrated in FIG. 16 is mounted on an inside of an area where the electrode pads 26 are formed in each of the semiconductor chip mounting areas D of the supporting board 14 illustrated in FIG. 18. Since the fixing layer 13 is formed on the rear surface of the semiconductor chip 11, the semiconductor chip 11 is fixed on the supporting board 14 via the fixing layer 13.

Figure 20:
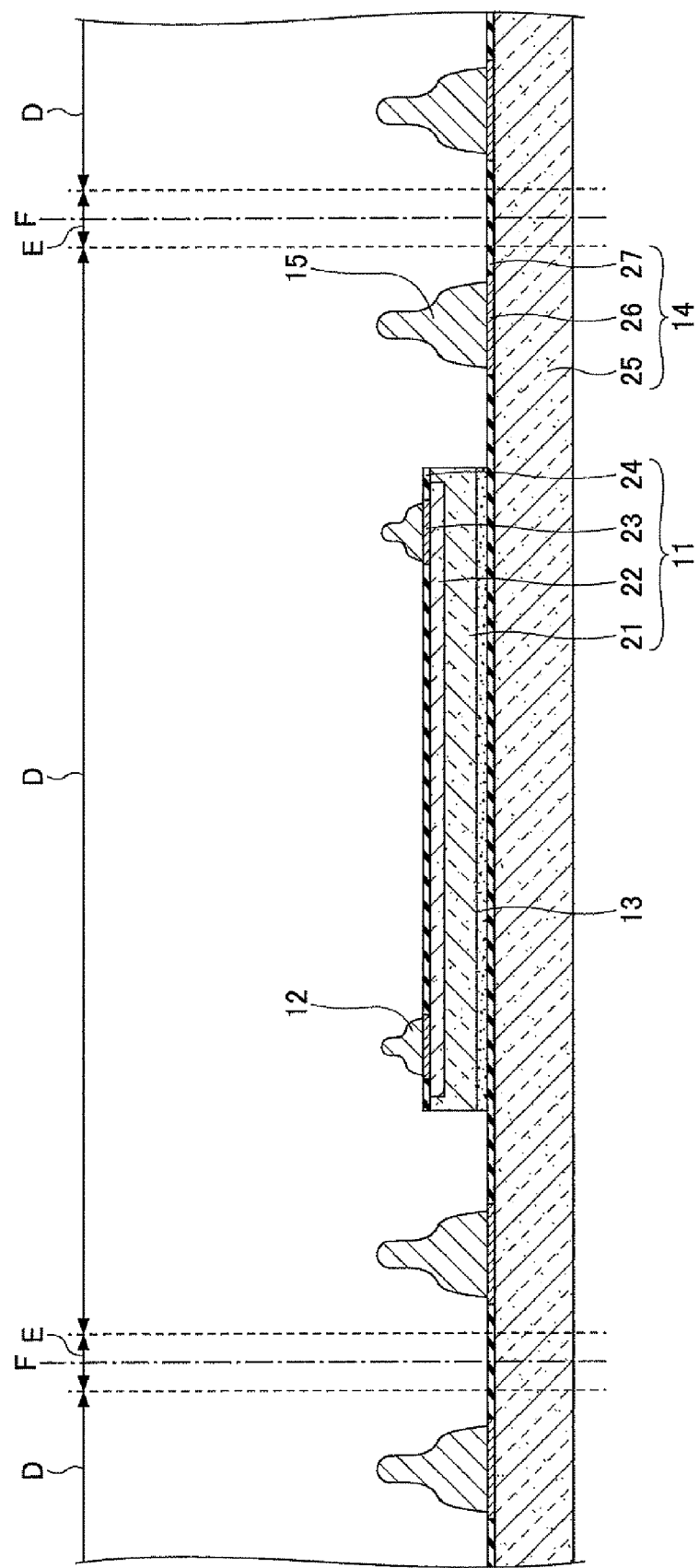
FIG. 20 is an eighth view showing the example of the manufacturing process of the semiconductor device of the first embodiment of the present invention.

Next, in a step illustrated in FIG. 20, the first internal connecting terminals 15 and the second internal connecting terminals 12 are formed on the electrode pads 23 and 26, respectively. As the first internal connecting terminal 13 and the second internal connecting terminal 12, for example, an Au bump, a Cu bump, an Au plating film, a metal film formed by a Ni film formed by an electroless plating method and an Au film covering the Ni film, or the like can be used. The Au bump or the Cu bump can be formed by a bonding wire by using, for example, a wire bonding apparatus. In addition, the Au bump or the Cu bump can be formed by using a plating method.

Figure 21:
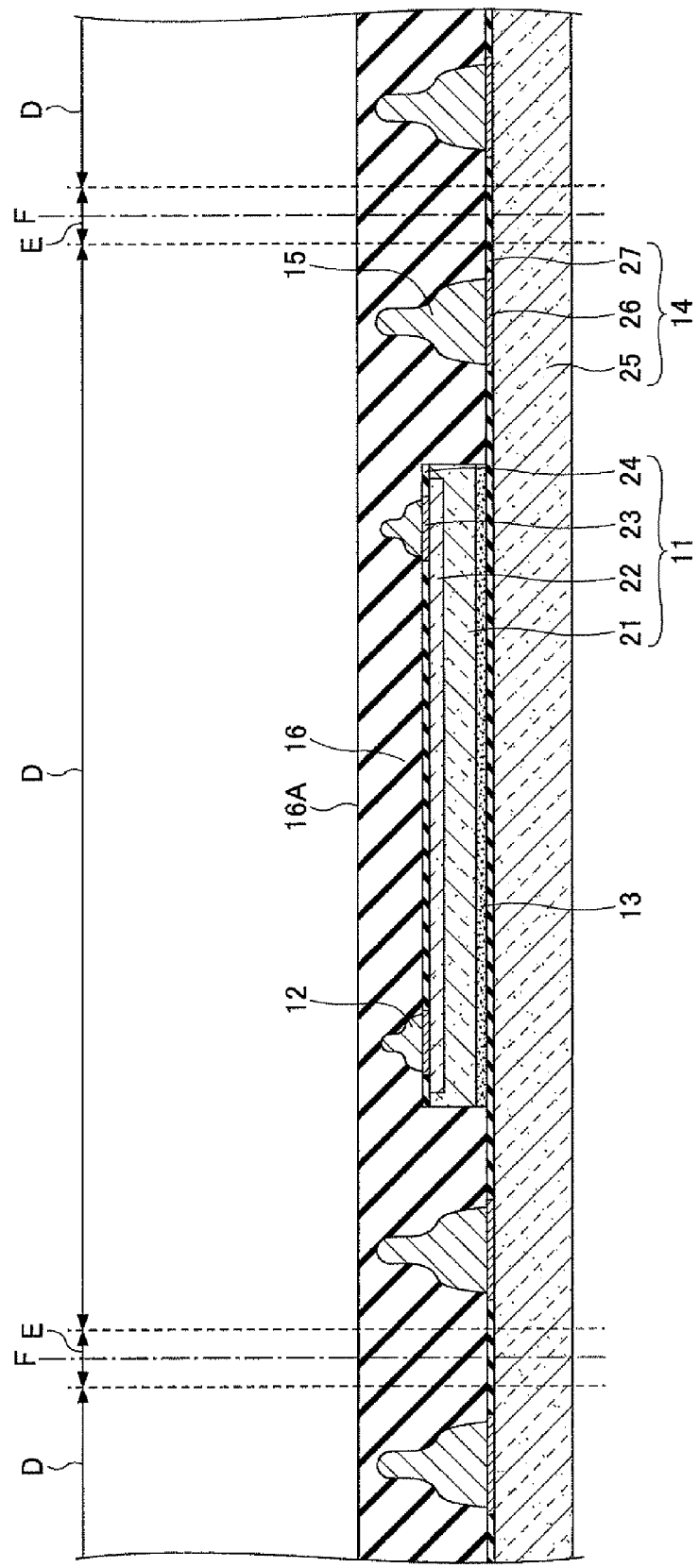
FIG. 21 is a ninth view showing the example of the manufacturing process of the semiconductor device of the first embodiment of the present invention.

Next, in a step illustrated in FIG. 21, the insulation layer 16 is formed on the supporting board 14 so as to cover the semiconductor chip 11, the first internal connecting terminals 15, and the second internal connecting terminals 12. As a material of the insulation layer 16, for example, sheet insulation resin having adhesion properties in a B-stage (semi-cured state) such as NCF (Non-Conductive Film), paste insulation resin such as NCP (Non Conductive Paste), sheet anisotropic conductive resin having adhesion properties such as ACF (Anisotropic Conductive Film), paste anisotropic conductive resin such as ACP (Anisotropic Conductive Paste), built-up resin such as epoxy resin including inorganic filler or epoxy resin excluding the inorganic filler, a liquid crystal polymer, or the like can be used.

In a case where the sheet insulation resin having adhesion properties or the anisotropic conductive resin is used as the insulation layer 16, the sheet insulation resin having adhesion properties or the anisotropic conductive resin is adhered to a surface of the structural body illustrated in FIG. 20 so that the insulation layer 16 is formed. In addition, in a case where the paste insulation resin or the anisotropic conductive resin is used as the insulation layer 16, the paste insulation resin or the anisotropic conductive resin is formed at the surface of the structural body illustrated in FIG. 20 by a printing method, and then pre-baking is performed so that the insulation resin or the anisotropic conductive resin is semi-cured. The semi-cured insulation resin or the anisotropic conductive resin has adhesion properties.

Figure 22:
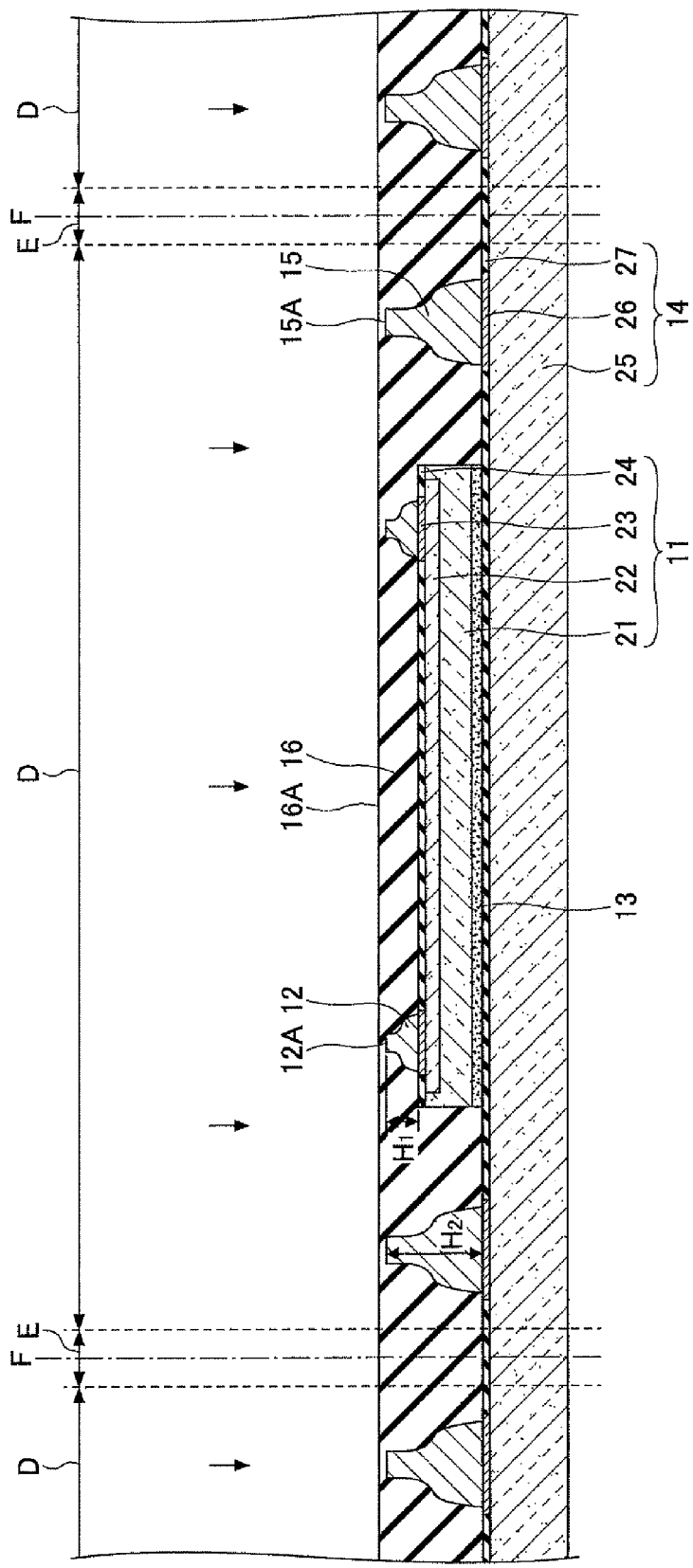
FIG. 22 is a tenth view showing the example of the manufacturing process of the semiconductor device of the first embodiment of the present invention.

Next, in a step illustrated in FIG. 22, the insulation layer 16 is pressed from the surface 16A side of the insulation layer 16 in an arrow direction of FIG. 22 while the structural body illustrated in FIG. 21 is heated. As a result of this, the surfaces of the structural body illustrated in FIG. 20 (more specifically, the surface 16A of the insulation layer 16, the surfaces 15A of the first internal connecting terminals 15, and the surfaces 12A of the second internal connecting terminals 12) become flat. In other words, a flattening process for the surface 16A of the insulation layer 16, the surfaces 15A of the first internal connecting terminals 15, and the surfaces 12A of the second internal connecting terminals 12 can be performed at the same time in a batch.

In addition, by heating the structural body illustrated in FIG. 22 at a temperature higher than a temperature at the time of pressing (at a curing temperature of the insulation layer 16), the insulation layer 16 is cured. The thickness of the insulation layer after pressing can be, for example, approximately 80 μm through approximately 160 μm. The height $H_1$ of the first internal connecting terminal 15 can be, for example, approximately 20 μm through approximately 50 μm. The height $H_2$ of the second internal connecting terminal 12 can be, for example, approximately 80 μm through approximately 160 μm. In this state, a part of material forming the insulation layer 16 is adhered to the surfaces 15A of the first internal connecting terminals 15 and the surfaces 12A of the second internal connecting terminals 12. Hence, the surfaces 15A of the first internal connecting terminals 15 and the surfaces 12A of the second internal connecting terminals 12 are not completely exposed from the insulation layer 16.

Figure 23:
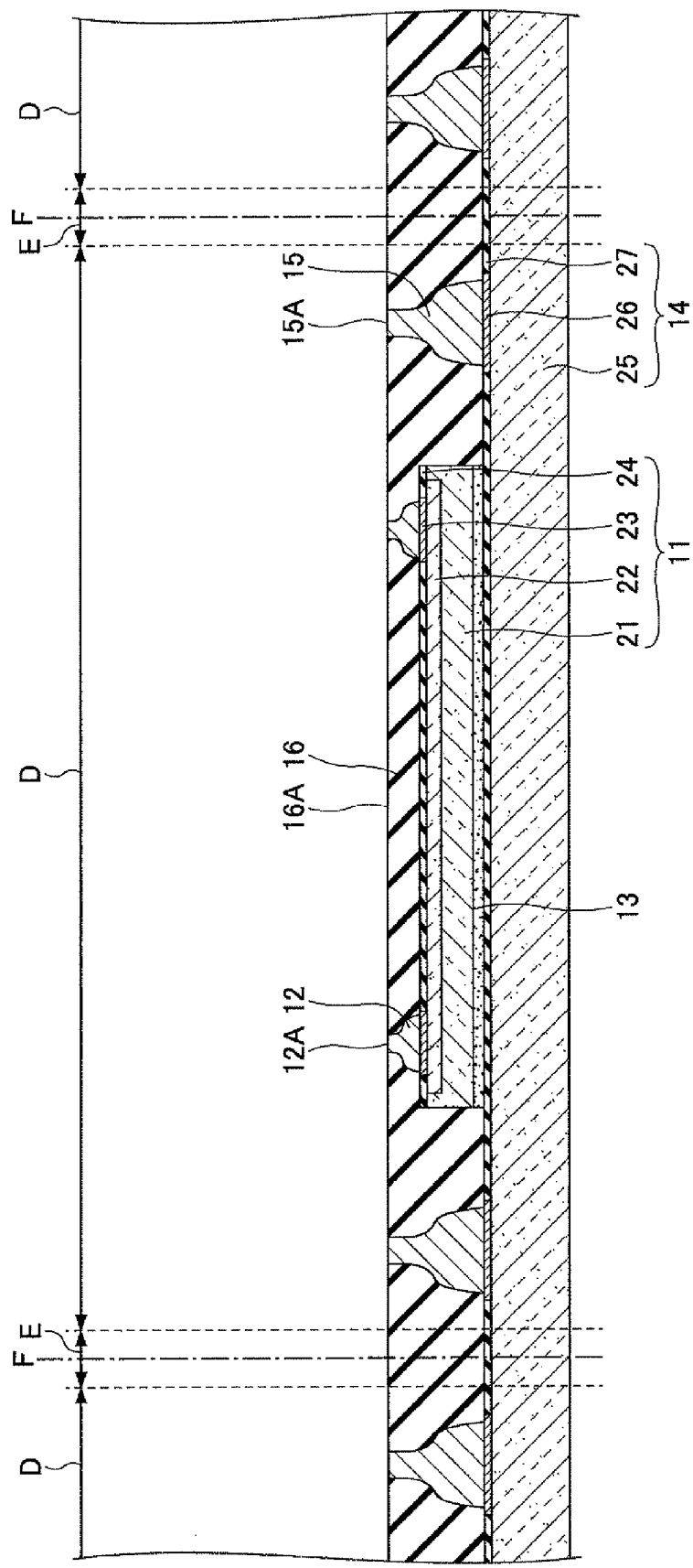
FIG. 23 is an eleventh view showing the example of the manufacturing process of the semiconductor device of the first embodiment of the present invention.

Next, in a step illustrated in FIG. 23, an ashing process is applied to the surface 16A of the insulation layer 16, so that the surfaces 15A of the first internal connecting terminals 15 and the surfaces 12A of the second internal connecting terminals 12 are completely exposed from the insulation layer 16 and the surface 16A of the insulation layer 16 is roughened. In the ashing process, for example, $O_2$ plasma ashing or the like can be used.

Various kinds of inert gas, if necessary, may be added to oxygen gas to be supplied. As the inert gas, for example, argon group gas, hydrogen group gas, nitrogen group gas, CF group gas such as $CF_4$ or $C_2F_6$, or the like can be used. Although ozone ashing or the like, instead of the $O_2$ plasma ashing, may be performed, in the case of the ozone ashing, a sufficient etching characteristic may not be obtained depending on the material of the insulation layer 16 or the etching rate may be degraded, compared to the $O_2$ plasma ashing, so that the productivity may be degraded.

A surface where the ashing process is applied is roughened so that minute concavities and convexities are formed on the surface. By roughening the surface 16A of the insulation layer 16 in the step illustrated in FIG. 23, it is possible to heighten the adhesion capabilities with the first metal layer 28 to be formed on the surface 16A of the insulation layer 16 in a step illustrated in FIG. 24. In addition, it is possible to heighten the adhesion capabilities with the solder resist layer 18 to be formed in a step illustrated in FIG. 25.

Figure 24:
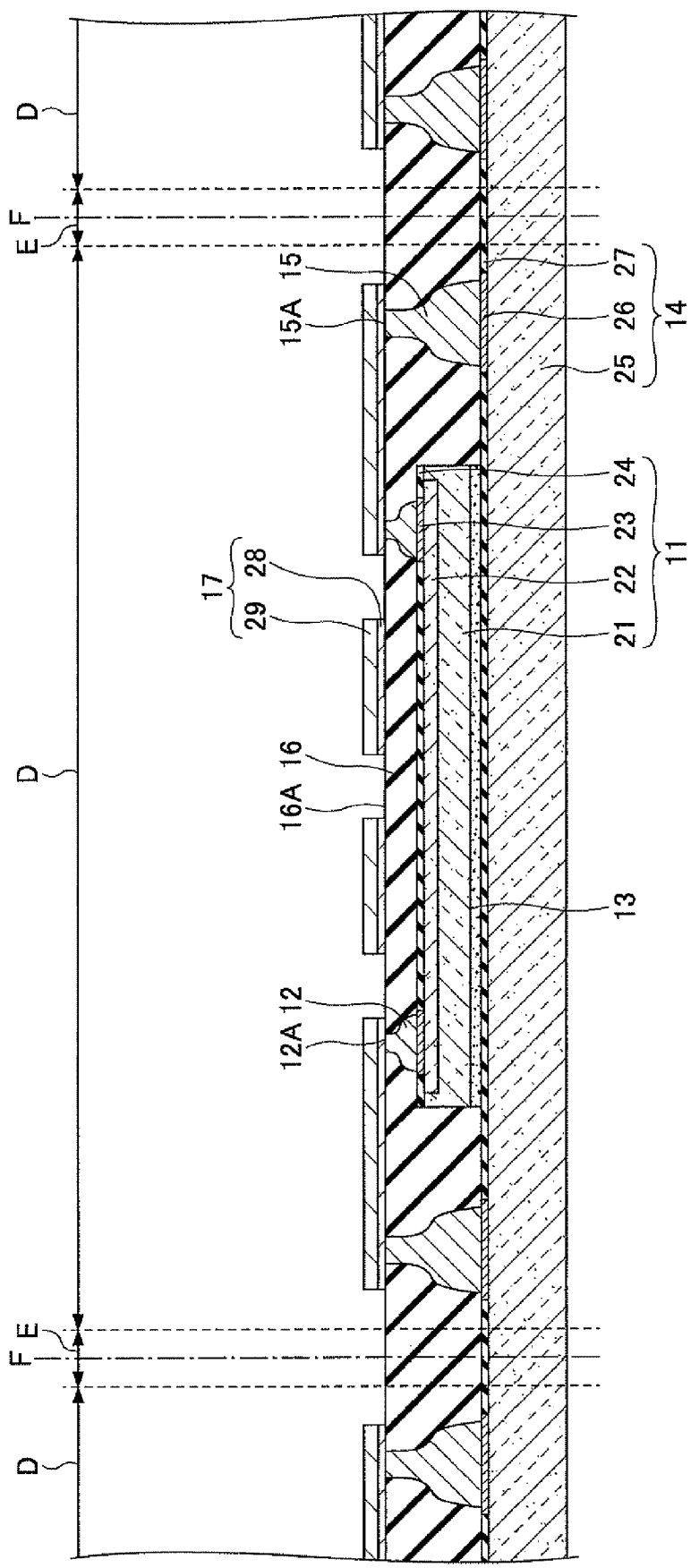
FIG. 24 is a twelfth view showing the example of the manufacturing process of the semiconductor device of the first embodiment of the present invention.

Next, in the step illustrated in FIG. 24, the wiring pattern 17 is formed on the surface 16A of the insulation layer 16 by, for example, a semi-additive process. More specifically, first, the first metal layer 28 is formed on the surface 16A of the insulation layer 16 by an electroless plating method or a sputtering method. As the first metal layer 28, a layered product where, for example, a Ti film and a Cu film are stacked in this order, a layered product where a Cr film and a Cu film are stacked in this order, a single layer structural body of a Cu film, or the like can be used. The thickness of the first metal layer 28 can be, for example, approximately 1 μm. Next, a resist layer (not illustrated in FIG. 24) having an opening part corresponding to the wiring pattern 17 is formed on the first metal layer 28.

Next, by an electrolytic plating method where the first metal layer 28 is used as a feeding layer, the second metal layer 29 is formed in the opening parts of the resist layer. As a material of the second metal layer 29, for example, Cu or the like can be used. The thickness of the second metal layer can be, for example, approximately 10 μm. After the resist layer is removed, portions of the first metal layer 28 not covered with the second metal layer 29 are removed by an etching process using the second metal layer 29 as a mask. As a result of this, the wiring pattern 17 including the first metal layer 28 and the second metal layer 29 is formed on the surface 16A of the insulation layer 16. The wiring pattern 17 can be formed by various kinds of the wiring forming methods such as a subtractive method, in addition to the semi-additive method.

After that, a roughening process of the wiring pattern 17 is performed. The roughening process of the wiring pattern 17 can be performed by either a blacking process or a roughening etching process. By the roughening process, it is possible to improve adhesion ability between the wiring pattern 17 and the solder resist layer 18 to be formed on the upper surface and the side surface of the wiring pattern 17.

Figure 25:
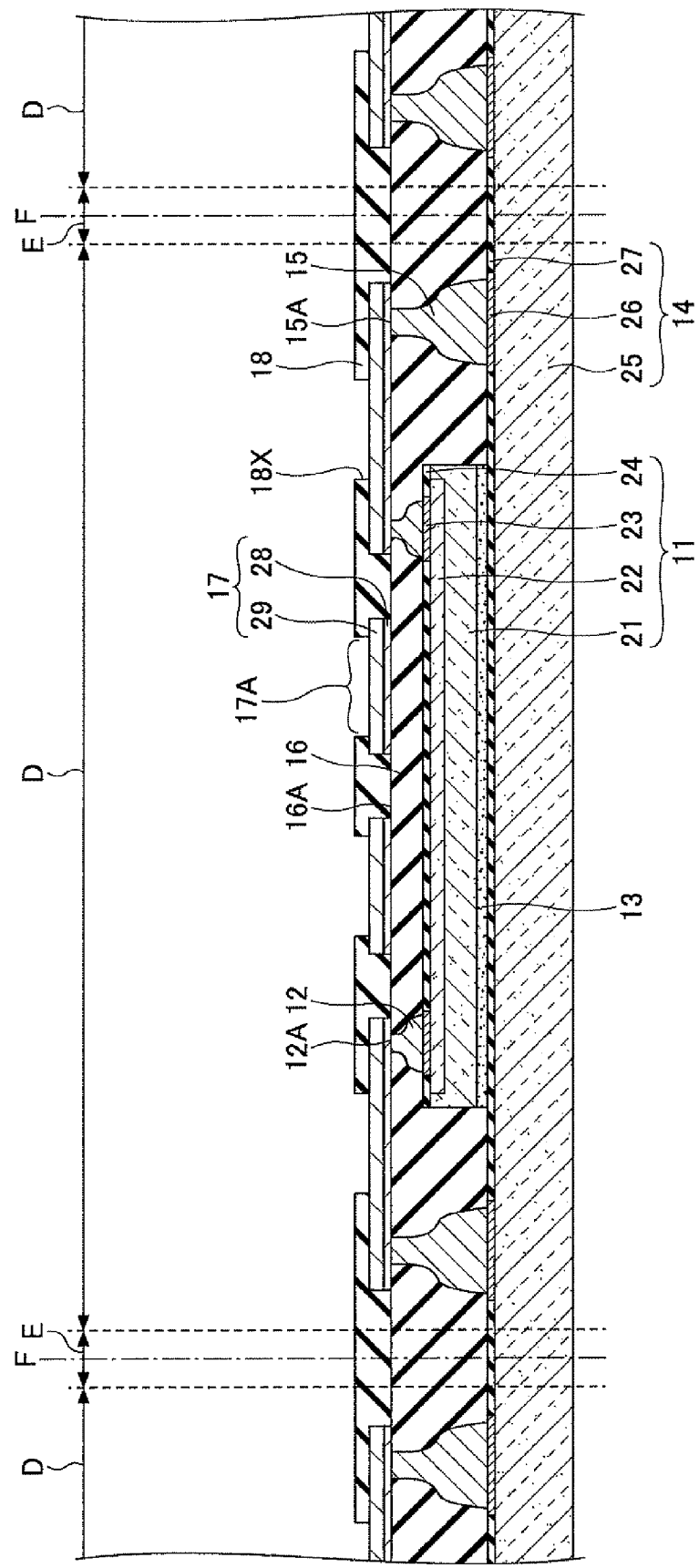
FIG. 25 is a thirteenth view showing the example of the manufacturing process of the semiconductor device of the first embodiment of the present invention.

Next, in the step illustrated in FIG. 25, the resist is applied so as to cover the insulation layer 16 and the wiring pattern 17. Then, the resist is exposed and developed by a photolithography method. The resist at a portion corresponding to the external connecting terminal providing area 17A is removed by etching. As a result of this, the solder resist layer 18 having an opening part 18X configured to expose the external connecting terminal providing area 17A is formed. As the material of the solder resist layer 18, resin whose main ingredient is, for example, epoxy, epoxy acrylate, cyanate ester, or siloxane, can be used.

Figure 26:
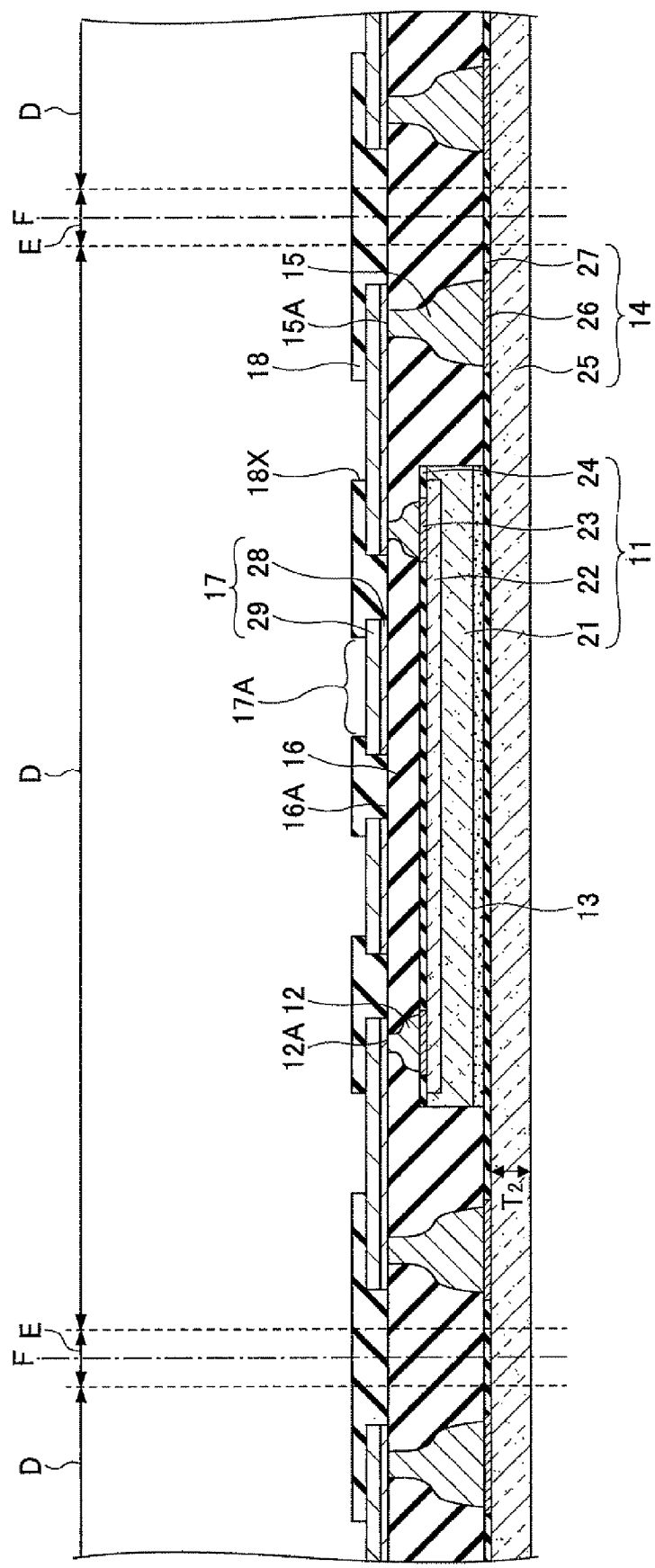
FIG. 26 is a fourteenth view showing the example of the manufacturing process of the semiconductor device of the first embodiment of the present invention.

Next, in a step illustrated in FIG. 26, the semiconductor substrate 25 is ground from the rear surface side of the semiconductor substrate 25 so that the semiconductor substrate 25 has a thin plate-shaped configuration. A back side grinder, for example, can be used for making the thin plate-shaped configuration of the semiconductor substrate 25. The thickness $T_2$ of the semiconductor substrate 25 can be, for example, approximately 200 μm through approximately 500 μm. The step illustrated in FIG. 26 may be omitted.

Figure 27:
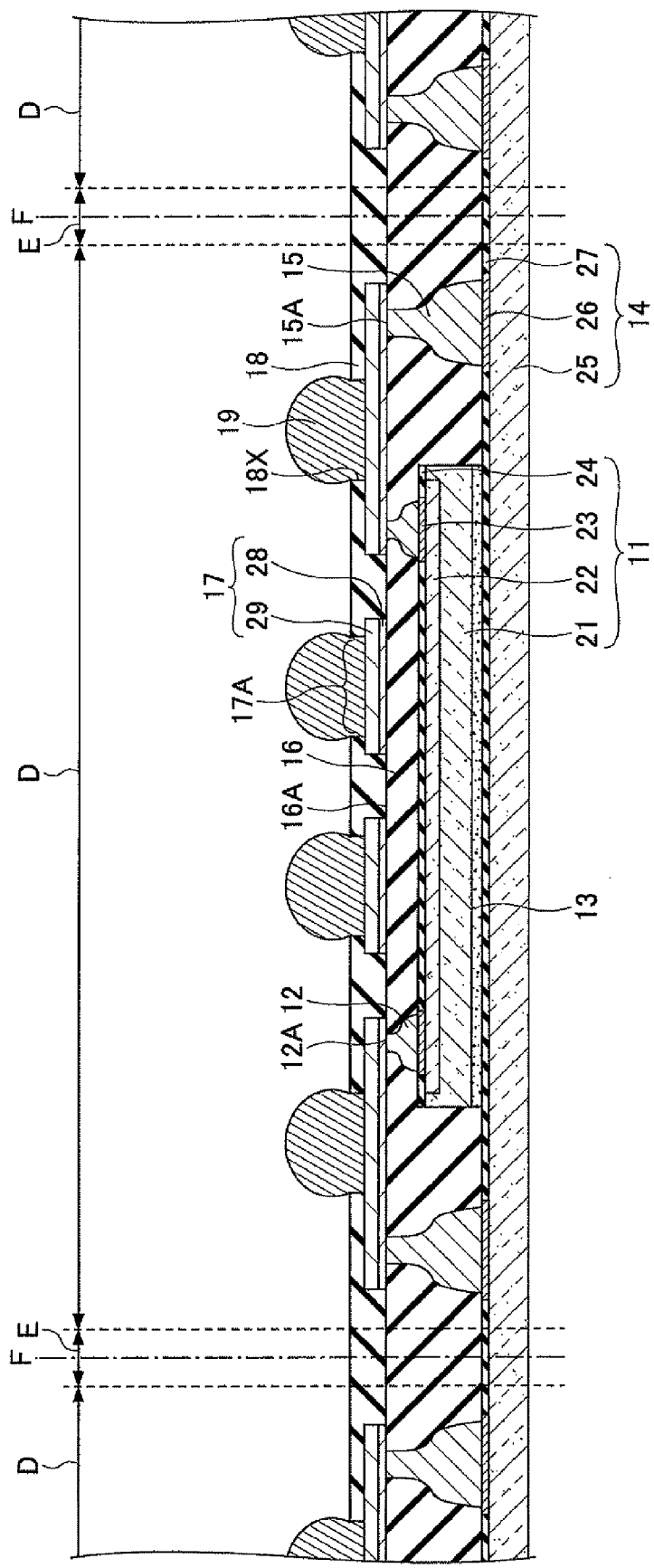
FIG. 27 is a fifteenth view showing the example of the manufacturing process of the semiconductor device of the first embodiment of the present invention.

Next, in a step illustrated in FIG. 27, the external connecting terminals 19 are formed on the external connecting terminal providing areas 17A of the wiring patterns 17. As the external connecting terminal 19, for example, a solder bump or the like can be used. As materials of the external connecting terminals 19, for example, an alloy including Pb, an alloy of Sn and Cu, an alloy of Sn and Ag, an alloy of Sn, Ag, and Cu, and other metals and alloys can be used. In addition, a solder ball (Sn-3.5 Ag) having a core made of resin such as divinylbenzene may be used for the external connecting terminal 19.

Although the external connecting terminals 19 are formed in this embodiment, it is not always necessary to form the external connecting terminals 19. In other words, it is sufficient to expose the external connecting terminal providing areas 17A so that the external connecting terminals 19 may be formed if necessary.

As a result of this, a structural body, corresponding to plural semiconductor devices 10 having the so-called fan-out structure where the semiconductor chip 11 is mounted, is formed. The step illustrated in FIG. 27 may be performed before the step illustrated in FIG. 26. In this case, a back grind tape, which can accept the height of the external connecting terminal 19, is formed and the rear surface of the semiconductor substrate 25 can be ground by this back grind tape.

Figure 28:
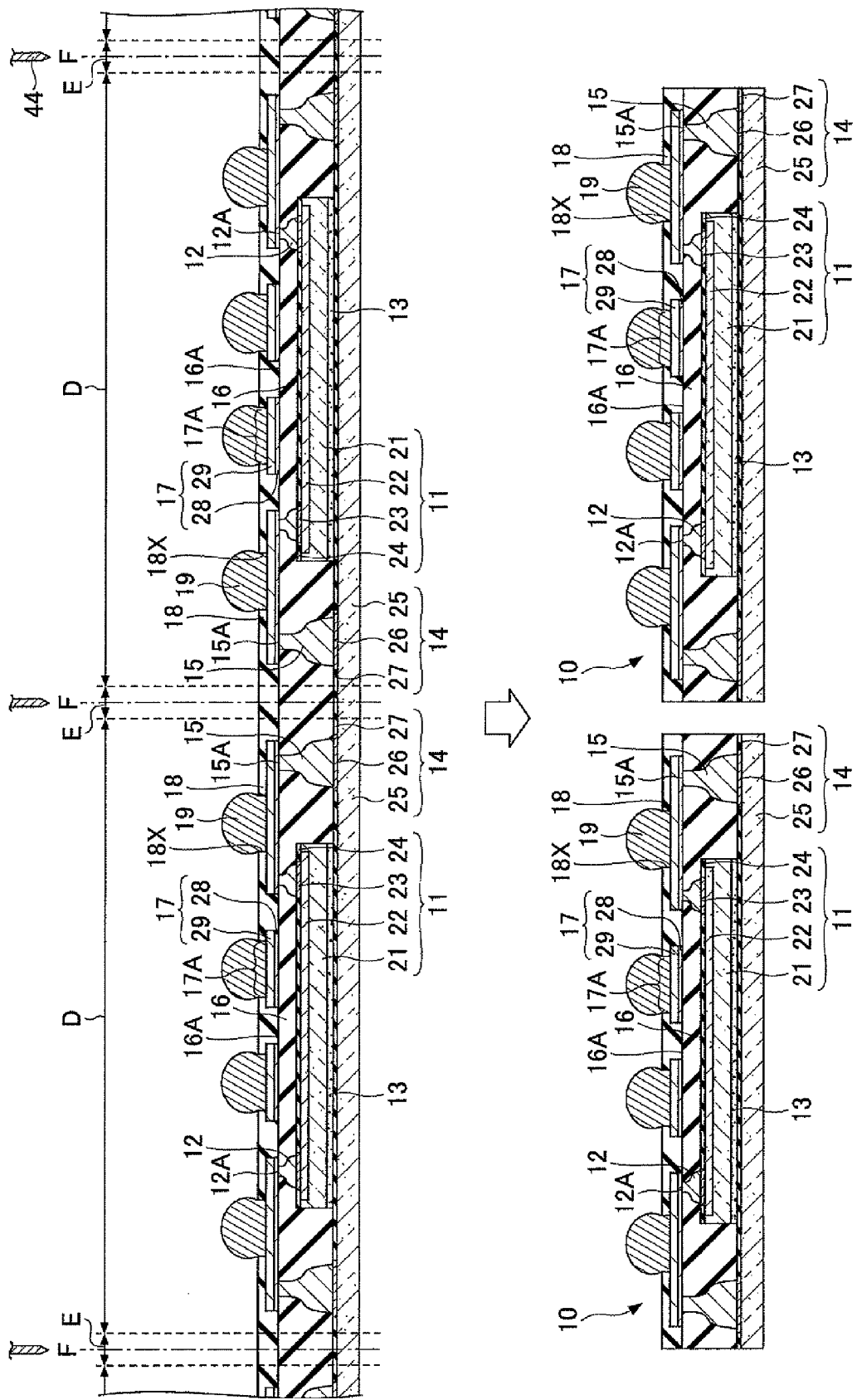
FIG. 28 is a sixteenth view showing the example of the manufacturing process of the semiconductor device of the first embodiment of the present invention.

Next, in a step illustrated in FIG. 28, the solder resist layer 18, the insulation layer 16, the protection film 24 and the semiconductor substrate 25 of a portion corresponding to the scribing area E are cut in the substrate cutting position F, and thereby pieces of plural semiconductor devices 10 are manufactured. The semiconductor substrate 25 and other parts can be cut by, for example, a blade dicing method or the like using the dicing blade 44 having a width less than the width of the scribing area E.

Thus, according to the manufacturing method of the semiconductor device 10 of the first embodiment of the present invention, an electrode pad is formed at an external edge part of a semiconductor chip mounting area of a supporting board, the supporting board having a main surface where the semiconductor chip mounting area is provided. A rear surface of a semiconductor chip having a main surface, the main surface being where an electrode pad is formed, is fixed to an inside of an area of the main surface of the supporting board, the area being where the electrode pad is formed. Then, a first internal connecting terminal is formed on the electrode pad provided on the main surface of the supporting board, and a second internal connecting terminal is formed on the electrode pad provided on the main surface of the semiconductor chip. In addition, an insulation layer is formed on the main surface of the supporting board so as to cover the semiconductor chip and expose parts of the first internal connecting terminal and the second internal connecting terminal. In addition, a wiring pattern including wiring configured to electrically connect the first internal connecting terminal and the second internal connecting terminal to each other is formed on the insulation layer. In addition, a solder resist layer having an opening part, the opening part being configured to expose an external connecting terminal providing area of the wiring pattern is formed so as to cover the wiring pattern formed on the insulation layer. The opening part is arranged in an area including a portion outside the area where the second internal connecting terminal is formed. In addition, an outside connecting terminal may be formed in the external connecting terminal providing area exposed in the opening part. Thus, since the opening part of the solder resist layer is arranged in an area including a portion outside the area where the second internal connecting terminal is formed, it is possible to realize a semiconductor device which can have the so-called fan-out structure by forming the external connecting terminal in the external connecting terminal providing area exposed in the opening part.

In addition, by covering the first internal connecting terminal and the second internal connecting terminal by a single insulation layer, it is possible to prevent a partial stress from being applied to the first internal connecting terminal and the second internal connecting terminal. Hence, it is possible to prevent cracks from being generated at the first internal connecting terminal and the second internal connecting terminal.

Second Embodiment

Figure 29:
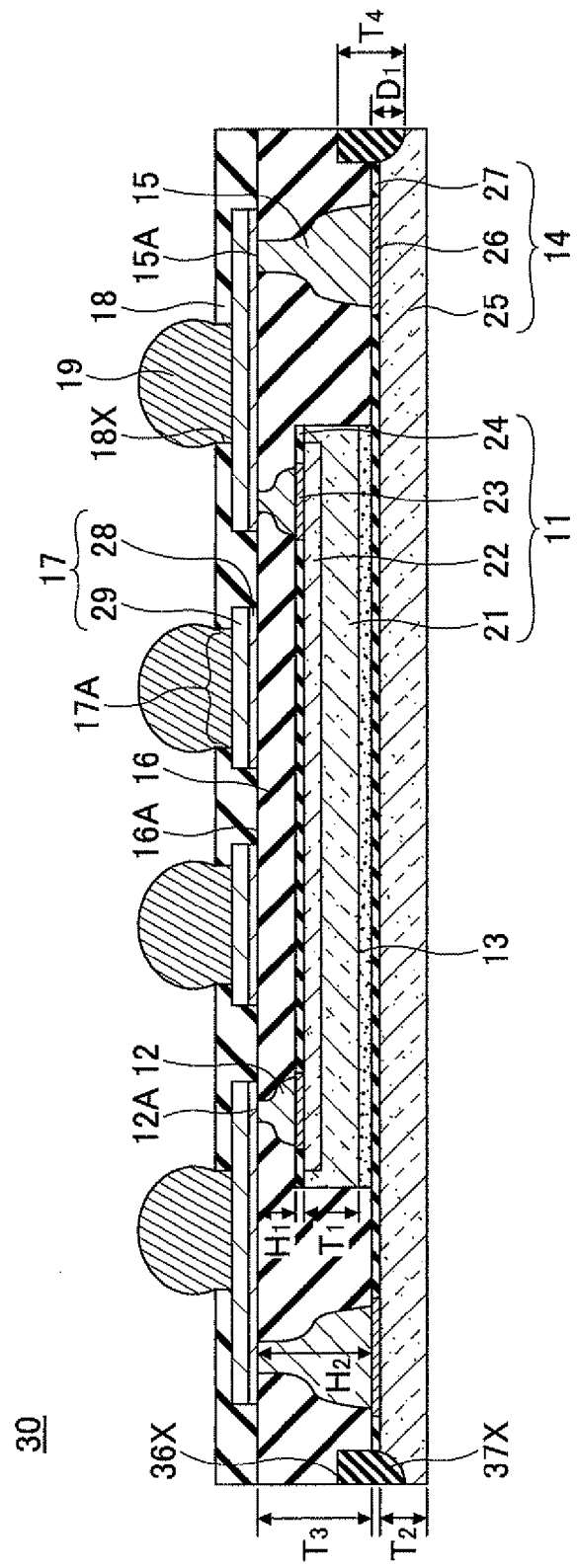
FIG. 29 is a cross-sectional view of an example of a semiconductor device of a second embodiment of the present invention.
Figure 30:
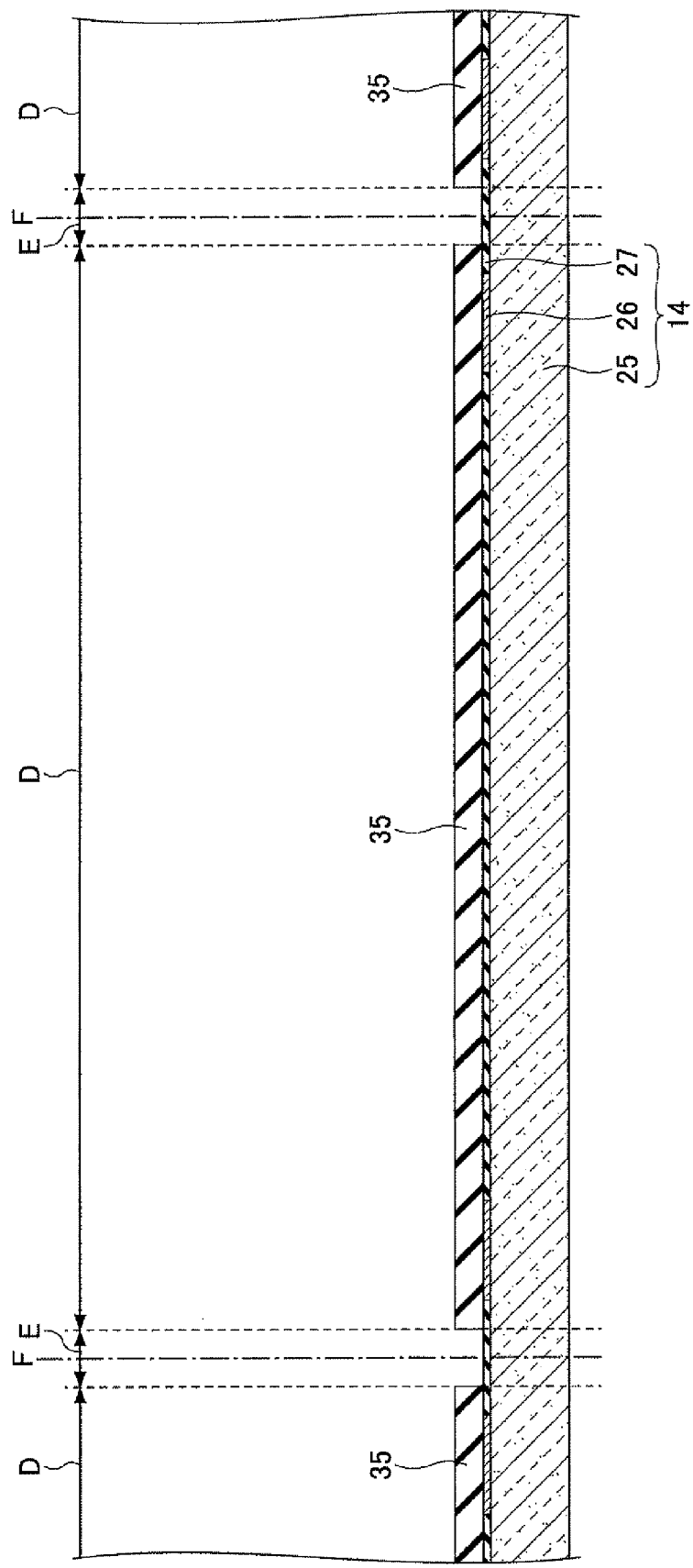
FIG. 30 is a first view showing an example of a manufacturing process of the semiconductor device of the second embodiment of the present invention.

FIG. 29 is a cross-sectional view of an example of a semiconductor device of a second embodiment of the present invention. In a semiconductor device 30 illustrated in FIG. 29, parts that are the same as the parts of the semiconductor device 10 illustrated in FIG. 12 are given the same reference numerals, and explanation thereof may be omitted. As illustrated in FIG. 29, the semiconductor device 30 of the second embodiment has the same structure as that of the semiconductor device 10 except that the semiconductor device 30 includes a notch part 36X where a resin layer 37X is formed. In the following explanation, details of portions the same as those of the semiconductor device 10 are omitted but portions different from the portions of the semiconductor device 10 are mainly discussed.

The notch part 36X and the resin layer 37X are formed at external edge parts of the semiconductor substrate 25, the protection film 27, and the insulation layer 16. In a case where, for example, the semiconductor device 10 has a rectangular configuration in a planar view, the notch part 36 is formed at the external edge parts of the semiconductor substrate 25, the protection film 27, and the insulation layer 16 in a frame shape. The width of the notch part 36X is less than the width (for example, approximately 30 μm through approximately 200 μm) of the scribing area B. The depth $D_1$ of the notch part 36X where the main surface of the semiconductor chip 11 is a standard surface can be, for example, approximately 5 μm through approximately 30 μm. Minute concavities and convexities (not illustrated in FIG. 29) are formed at the surface of the notch part 36X.

As a material of the resin layer 37X, it is preferable to use low elasticity resin (resin having an elasticity rate of, for example, approximately 20 MPa through approximately 100 MPa). As the material of the resin layer 37X, for example, epoxy group or polyimide group insulation resin, epoxy group or polyimide group anisotropic conductive resin, or the like can be used. By using the low elasticity resin (resin having an elasticity rate of, for example, approximately 20 MPa through approximately 100 MPa) as the material of the resin layer 37X, it is possible to have good adhesion properties with silicon. The thickness $T_4$ of the resin layer 37X can be, for example, approximately 15 μm through approximately 40 μm.

In the semiconductor device 10 of the first embodiment, the insulation layer 16 may be detached from the protection film 27 based on bad adhesion properties with the insulation layer 16 formed on the protection film 27 of the supporting board 14 and the protection film 27. On the other hand, in the semiconductor device 30 of the second embodiment, the notch part 36X is provided at the external edge part of the semiconductor substrate 25, the protection film 27, and the insulation layer 16. The resin layer 37X is formed in the notch part 36X. Therefore, an interface of the protection film 27 and the insulation layer 16 is not exposed to an outside of the semiconductor device 30. Therefore, the insulation layer 16 does not become detached from the protection film 27.

In addition, since minute concavities and convexities (see FIG. 32) are formed at the surface of the notch part 36X, the resin layer 37X is engaged with the minute concavities and convexities formed at the surface of the notch part 36X. Therefore, a so-called anchor effect is generated between the resin layer 37X and the notch part 36X so that the adhesion properties between the resin layer 37X and the notch part 36X are improved. Accordingly, the interface between the semiconductor substrate 25 and the resin layer 37X is maintained.

FIG. 30 through FIG. 35 are views showing an example of a manufacturing process of the semiconductor device of the second embodiment of the present invention. In FIG. 30 through FIG. 35, parts that are the same as the parts of the semiconductor device 30 illustrated in FIG. 29 are given the same reference numerals, and explanation thereof may be omitted. With reference to FIG. 30 through FIG. 35, a manufacturing method of the semiconductor device 30 of the second embodiment of the present invention is discussed.

First, processes the same as steps illustrated in FIG. 13 through FIG. 18 and discussed in the first embodiment are performed. Next, in a step illustrated in FIG. 30, resist is applied on the electrode pad 26 and the protection film 27. Then, by exposing and developing the resist, the resist film 35 is formed on the parts of the electrode pad 26 and the protection film 27 excluding the scribing area E. Although the resist film 35 works as a mask in a blasting process in steps illustrated in FIG. 31 and FIG. 32, a portion of the surface of the resist film 35 is also shaved by the blasting process. Therefore, the thickness of the resist film 35 is formed so that the resist film 35 can be used as a mask in the blasting process even if the portion of the surface of the resist film 35 is also shaved by the blasting process. The thickness of the resist film 35 can be, for example, approximately 50 μm.

Figure 31:
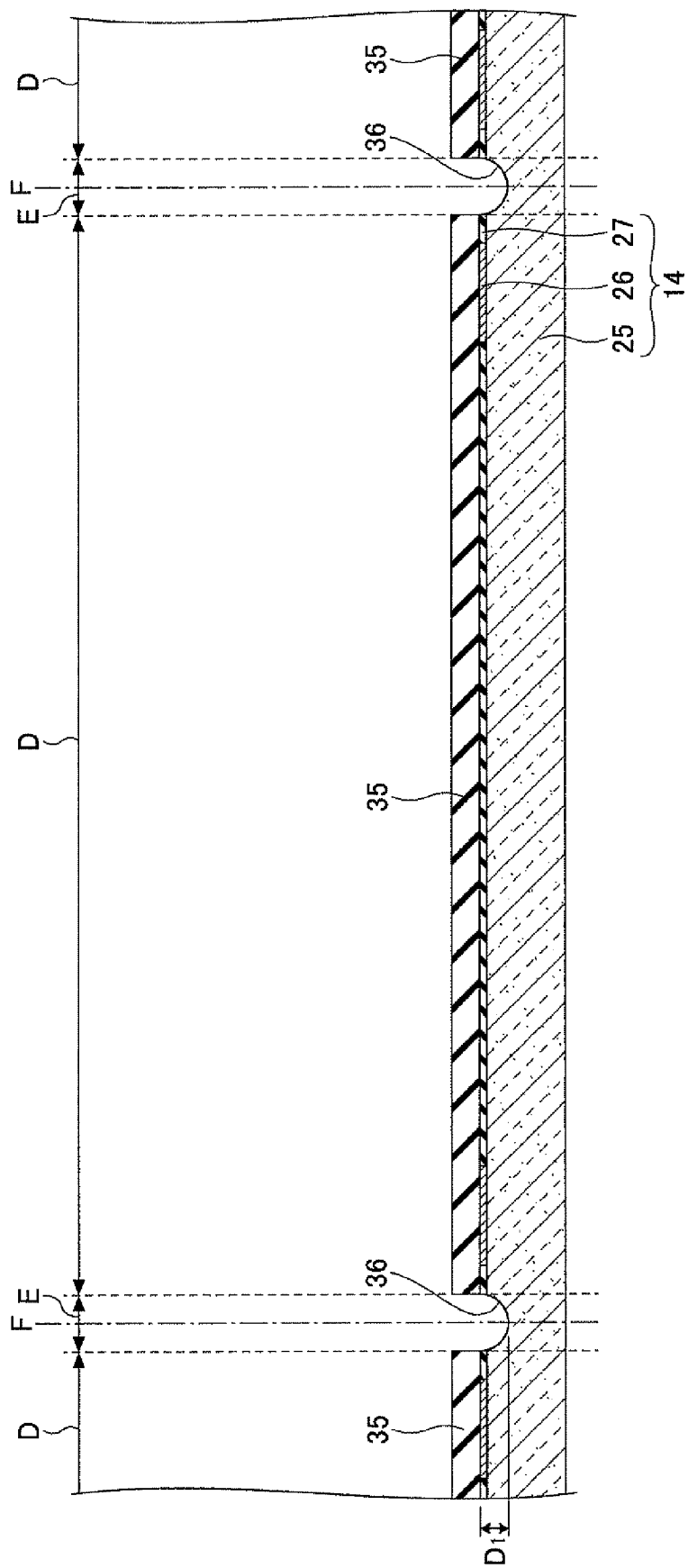
FIG. 31 is a second view showing the example of the manufacturing process of the semiconductor device of the second embodiment of the present invention.
Figure 32:
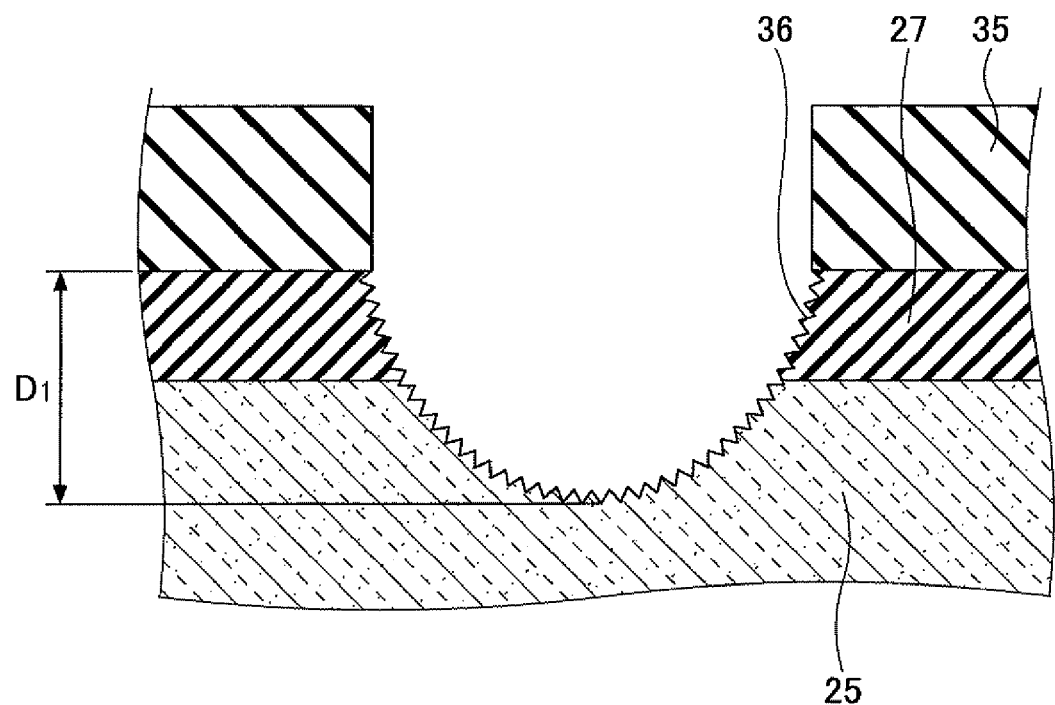
FIG. 32 is a third view showing the example of the manufacturing process of the semiconductor device of the second embodiment of the present invention.

Next, in steps illustrated in FIG. 31 and FIG. 32, the blasting process is performed by using the resist film 35 as the mask, so that parts of the protection film 27 and the semiconductor substrate 25 in the scribing area E are removed and a groove part 36 is formed in the scribing area E. The groove part 36 has, for example, a U-shaped configuration. The groove part 36 is finally cut down in the vicinity of the center so that the notch part 36X is formed. Here, FIG. 32 is an expanded view of the vicinity of the groove part 36 illustrated in FIG. 31. The width of the groove part 36 is substantially the same as the width (for example, approximately 30 μm through approximately 200 μm) of the scribing area E. The depth $D_1$ of the groove part 36 where the main surface of the semiconductor chip 11 is a standard surface can be, for example, approximately 5 μm through approximately 30 μm. The surface of the groove part 36 formed by the blasting process is roughened so that the minute concavities and convexities illustrated in FIG. 32 are formed.

Here, the blasting process is a process where a polishing agent is blown onto a process subject with a high pressure so that surface roughness of the process subject is mechanically controlled. Blasting processes includes a dry blasting process, a sand blasting process, a wet blasting process, and other processes. Especially, it is preferable to use the wet blasting process where the polishing agent such as alumina abrasive grain or spherical silica abrasive grain is diffused in a solvent such as water so as to collide with a surface of the process subject, so that a minute area is ground. This is because if the wet blasting process is used, compared to the dry blasting process, it is possible to perform grinding with extremely high accuracy and little damage. Furthermore, in the wet blasting process unlike the dry blasting process, since the polishing agent is diffused in the solvent such as water, the polishing agent does not fly in the air as dust. In addition, since the solvent such as water cleans the polishing agent in the process, it is possible to inhibit the residual of the polishing agent at the surface of the process subject.

A grain diameter of the polishing agent, such as alumina abrasive grain or spherical silica abrasive grain, used for the wet blasting process, can be, for example, approximately 5 μm through approximately 20 μm. The concentration of the polishing agent, such as alumina abrasive grain or spherical silica abrasive grain, diffused in the solvent such as water can be, for example, approximately 14 vol %. In addition, an injecting pressure at the time when the polishing agent diffused in the solvent such as water is injected onto the surface of the process subject may be, for example approximately 0.25 MPa.

Figure 33:
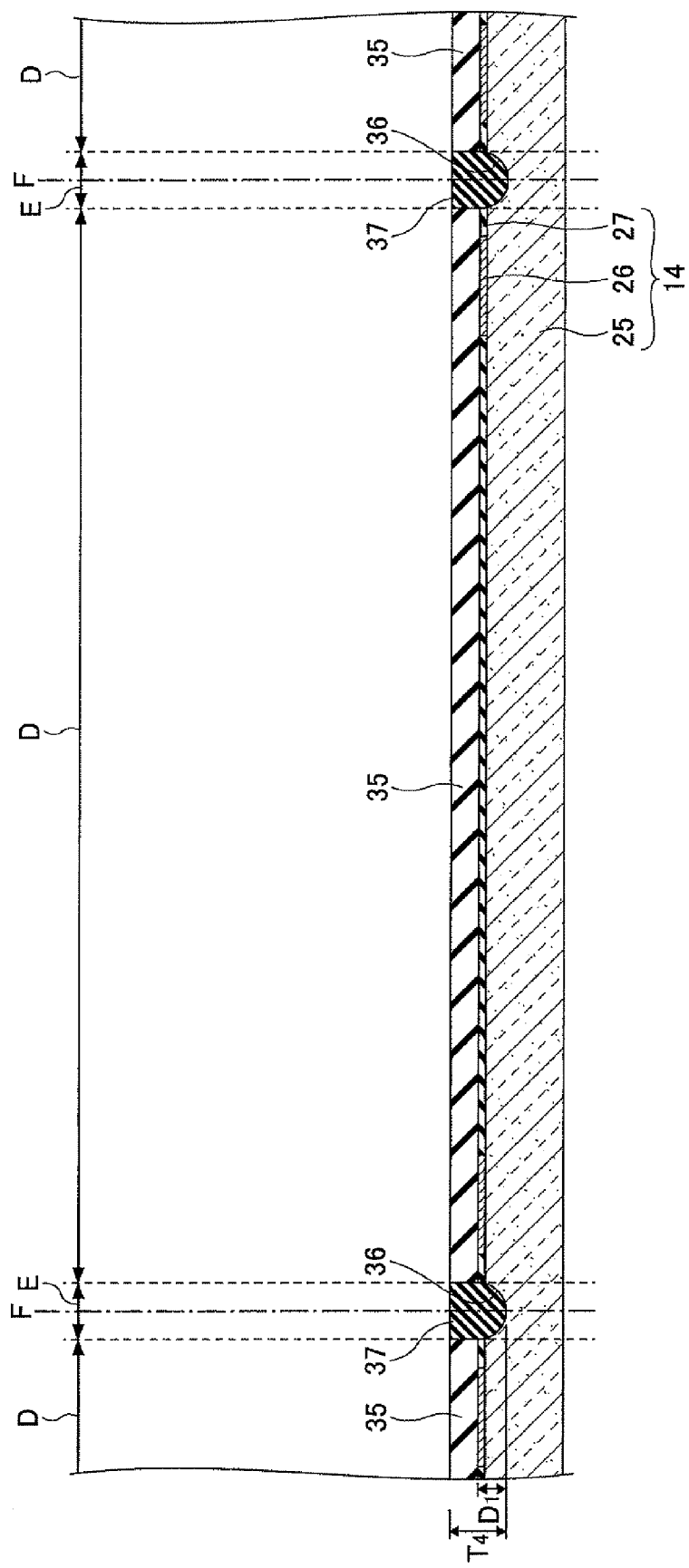
FIG. 33 is a fourth view showing the example of the manufacturing process of the semiconductor device of the second embodiment of the present invention.

Next, in steps illustrated in FIG. 33, by using the resist film 35 as a mask, liquid or paste resin is supplied to the groove part 36 by a printing method or the like and then the resin layer (semi-cured) is formed. The resin layer 37 is finally cut down in the vicinity of the center so that the resin layer 37X is formed. The thickness $T_4$ of the resin layer 37 can be, for example, approximately 15 μm through approximately 40 μm. As a material of the resin layer 37, it is preferable to use low elasticity resin (resin having an elasticity rate of, for example, approximately 20 MPa through approximately 100 MPa). As the material of the resin layer 37, for example, paste epoxy group or polyimide group insulation resin such as NCP (Non Conductive Paste), paste epoxy group or polyimide group anisotropic conductive resin such as ACP (Anisotropic Conductive Paste), or the like can be used. By using the low elasticity resin (resin having an elastic rate of, for example, approximately 20 MPa through approximately 100 MPa) as the material of the resin layer 37X, it is possible to have good adhesion properties with silicon.

Figure 34:
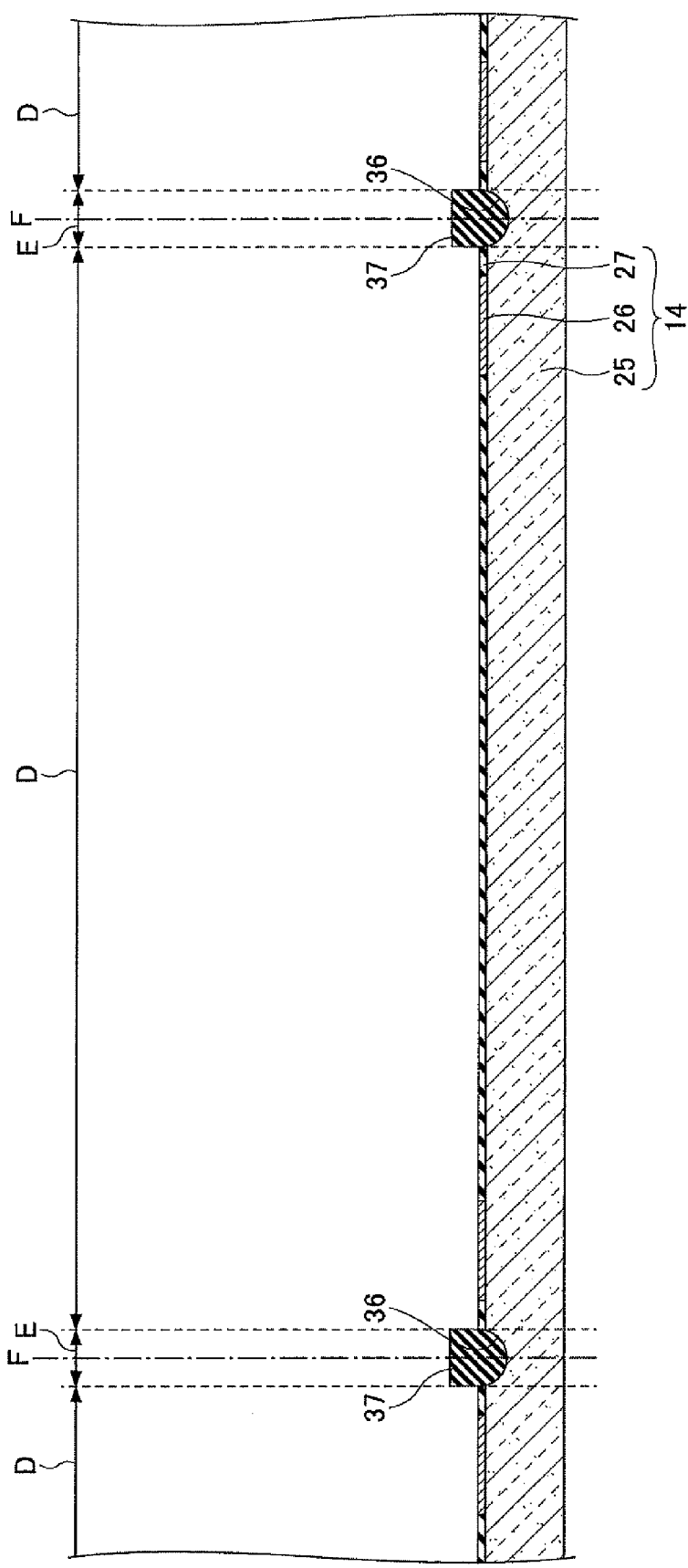
FIG. 34 is a fifth view showing the example of the manufacturing process of the semiconductor device of the second embodiment of the present invention.
Figure 35:
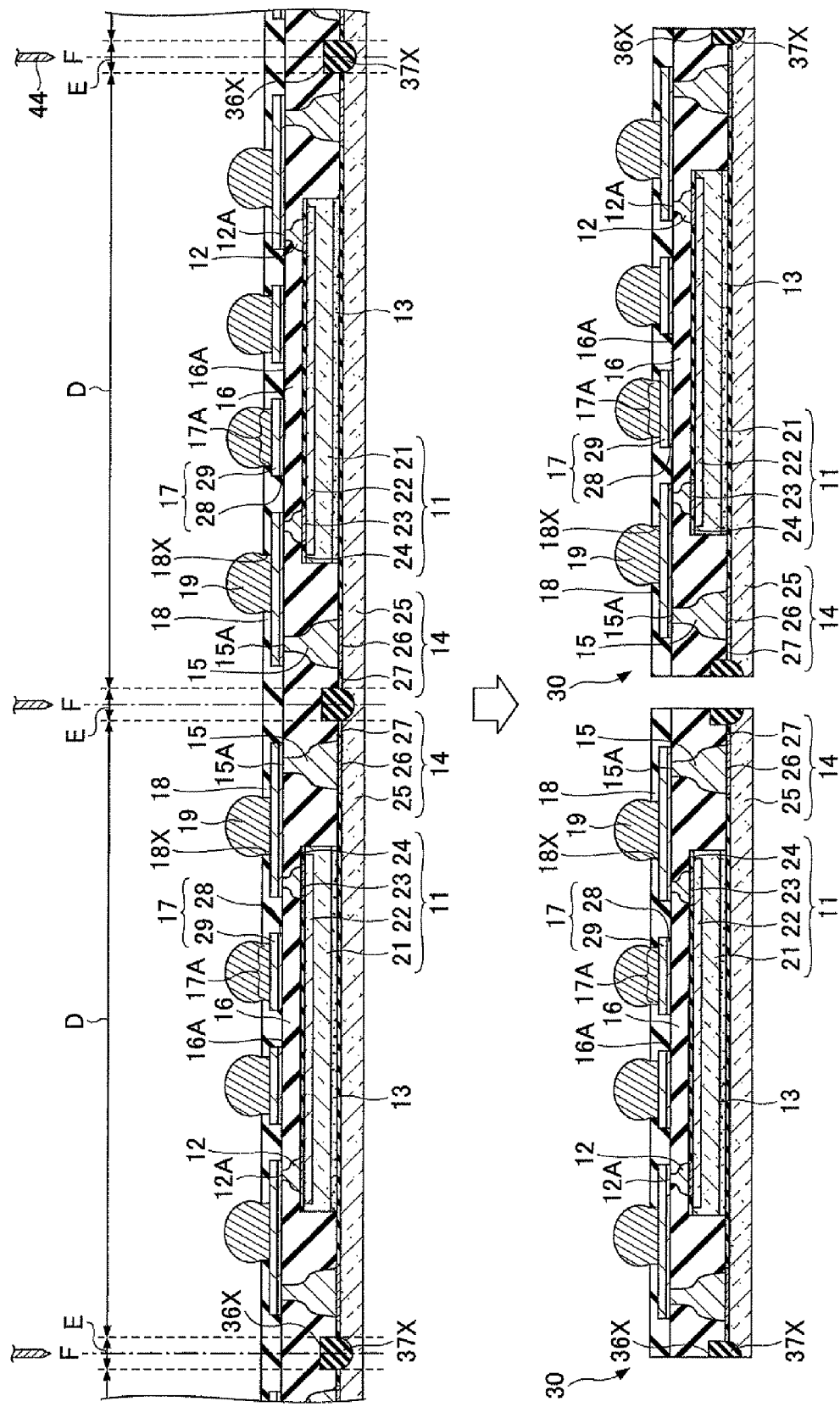
FIG. 35 is a sixth view showing the example of the manufacturing process of the semiconductor device of the second embodiment of the present invention.

Next, in a step illustrated in FIG. 34, after the resin layer 34 is cured, the resist film 35 illustrated in FIG. 33 is removed. The resin layer 37 can be cured by heating at, for example approximately 180° C. for approximately 1 hour through 2 hours. The heating may be performed under a nitrogen atmosphere.

Next, the same process as the steps illustrated in FIG. 19 through FIG. 27 discussed in the first embodiment is performed. Then, in a step illustrated in FIG. 35, the solder resist layer 18, the insulation layer 16, the resin layer 37 and the semiconductor substrate 25 of a portion corresponding to the scribing area E are cut in the substrate cutting position F, and thereby plural semiconductor devices 30 are manufactured. The semiconductor substrate 25 and other parts can be cut by, for example, a blade dicing method or the like using the dicing blade having a width less than the width of the scribing area E.

Thus, according to the second embodiment of the present invention, the same effect as the first embodiment can be achieved and the following effect can be further achieved. In other words, the notch part 36X is provided at the external edge part of the semiconductor substrate 25, the protection film 27, and the insulation layer 16. The resin layer 37X is formed in the notch part 36X. Therefore, an interface of the protection film 27 and the insulation layer 16 is not exposed to an outside of the semiconductor device 30. Therefore, the detachment of the interface of the insulation layer 16 and the protection film 27 can be prevented. It may be preferable to use the low elasticity resin (resin having an elasticity rate of, for example, approximately 20 MPa through approximately 100 MPa) as the material of the resin layer 37X.

Third Embodiment

Figure 36:
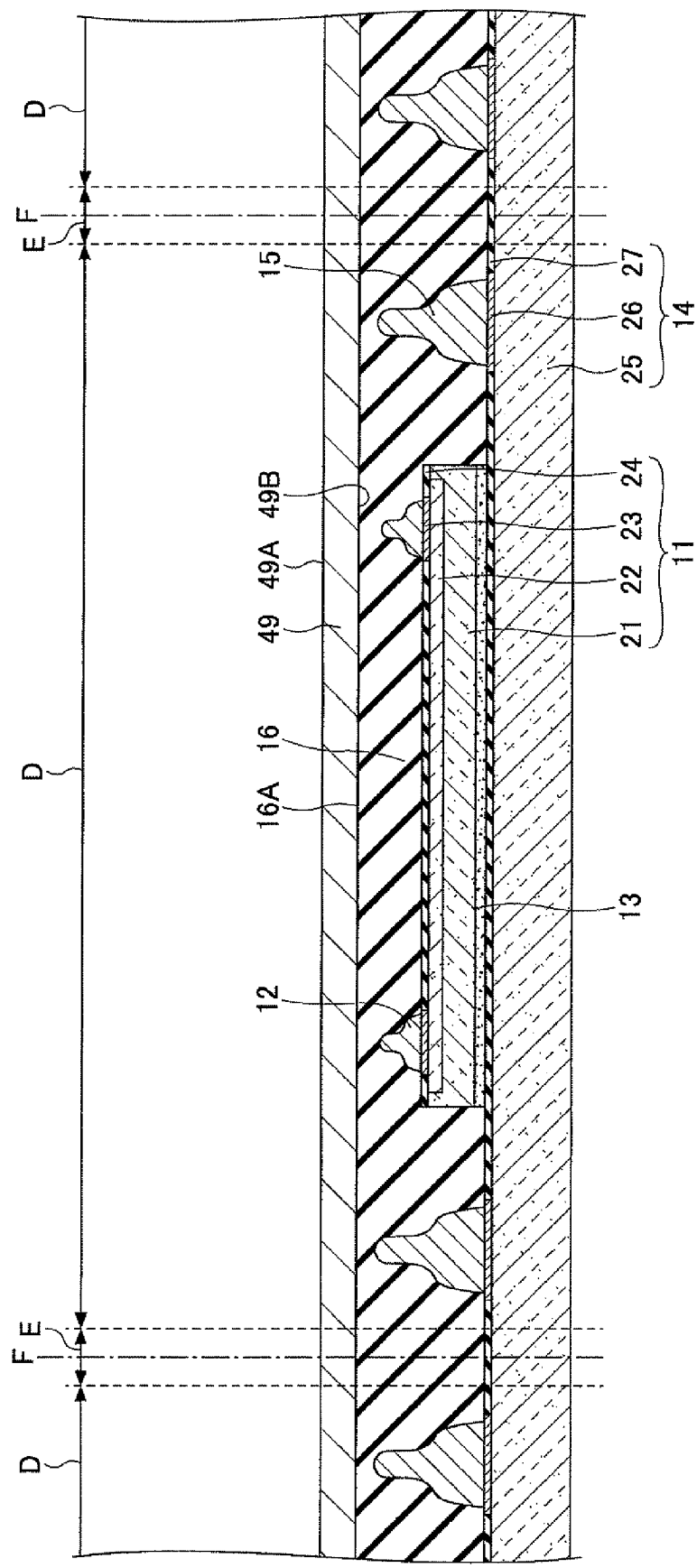
FIG. 36 is a first view showing an example of a manufacturing process of the semiconductor device of the third embodiment of the present invention.
Figure 37:
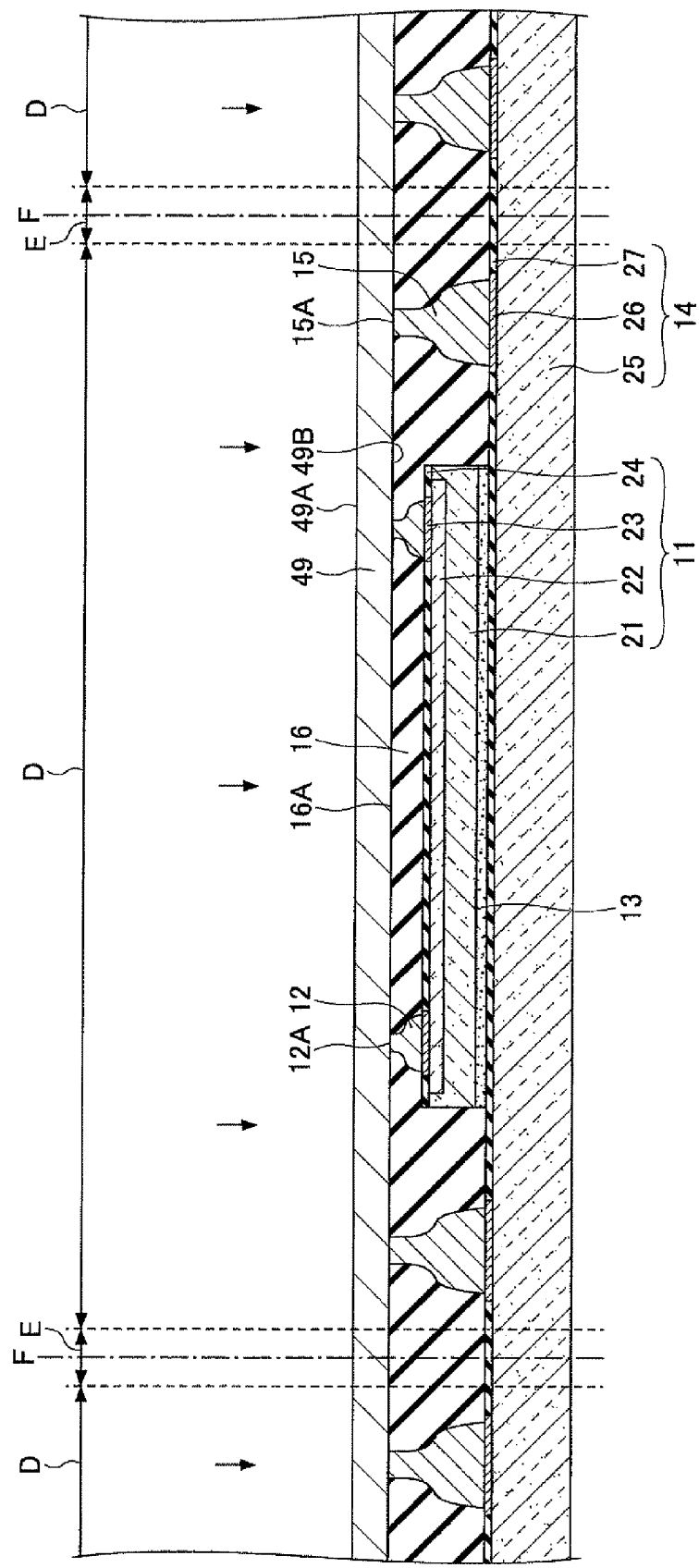
FIG. 37 is a second view showing the example of the manufacturing process of the semiconductor device of the third embodiment of the present invention.

In the third embodiment of the present invention, the steps illustrated in FIG. 22 and FIG. 23 in the first embodiment are replaced with steps illustrated in FIG. 36 through FIG. 38.

FIG. 36 through FIG. 38 are views showing an example of a manufacturing process of the semiconductor device of the third embodiment of the present invention. In FIG. 36 through FIG. 38, parts that are the same as the parts illustrated in FIG. 22 and FIG. 23 are given the same reference numerals, and explanation thereof may be omitted.

First, the same steps as the steps illustrated in FIG. 13 through FIG. 21 are performed. Next, in a step illustrated in FIG. 36, a plate-shaped body 49 is provided on the surface 16A of the insulation layer 16. A surface 49B of the plate shape body 49 facing the surface 16A of the insulation layer 16 is a roughened surface. The thickness of the plate-shaped body 49 can be, for example, approximately 10 μm. As the plate-shaped body 49, for example, a metal foil such as Cu foil can be used. In addition, as the plate-shaped body 49, a temporary film made of PET or the like may be used. Furthermore, as the plate-shaped body 49, a resin film where a copper foil is formed on a single surface of the resin film may be used. In the following explanation, an example where the metal foil is used as the plate-shaped body 49 is discussed.

Next, in a step illustrated in FIG. 37, in a state where the structural body illustrated in FIG. 36 is heated, the plate-shaped body 49 is pressed from the surface 49A side of the plate-shaped body 49 so that the plate-shaped body 49 is press-fixed to the insulation layer 16. As a result of this, the insulation layer 16 is pressed so that the surface 15A of the first internal connecting terminal 15 and the surface 12A of the second internal connecting terminal 12 are exposed from the surface 16A of the insulation layer 16. In addition, the roughness of a roughened surface 49B of the plate-shaped body 49 is transferred to the surface 16A of the insulation layer 16. By heating the structural body illustrated in FIG. 37, the insulation layer 16 is cured. The thickness of the insulation layer 16 after press-fixing may be, for example, approximately 80 μm through approximately 160 μm.

Next, in a step illustrated in FIG. 38, the entire plate-shaped body 49 illustrated in FIG. 37 is removed by etching. Since the roughness of the roughened surface 49B of the plate-shaped body 49 is transferred in the steps illustrated in FIG. 36 through FIG. 38, the surface 16A of the insulation layer 16 is roughened so that the minute concavities and convexities are formed. By roughening the surface 16A of the insulation layer 16 in the step illustrated in FIG. 24, it is possible to heighten the adhesion properties with the first metal layer 28 formed on the surface 16A of the insulation layer 16. In addition, it is possible to heighten the adhesion properties between the surface 16A of the insulation layer 16 and the solder resist layer 18 formed in the step illustrated in FIG. 25.

Next, the same processes as the steps illustrated in FIG. 24 through FIG. 28 discussed in the first embodiment are performed so that plural semiconductor devices 10 are manufactured.

Thus, according to the third embodiment of the present invention, it is possible to achieve the same effect as that of the first embodiment. In addition, the third embodiment can be combined with the second embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

For example, in the step illustrated in FIG. 13, The semiconductor substrate 21 including plural semiconductor device forming areas A and the scribing areas B including the substrate cutting positions C whereby plural semiconductor device forming areas A are separated from each other is used. However, it is not always necessary that plural semiconductor chips are formed at the semiconductor substrate. Only a single semiconductor chip may be formed at a single semiconductor substrate.

In addition, in the first embodiment through the third embodiment, a single layer of the wiring pattern is provided. However, the present invention is not limited to this. The wiring pattern may have a multilayer structure. By providing a multilayer structure wiring pattern, it is possible to use a semiconductor chip having a high density design.

Thus, according to the embodiments of the present invention, it is possible to provide a manufacturing method of a semiconductor device having the so-called fan-out structure.

What is claimed is:

1. A manufacturing method of a semiconductor device, comprising:
   a first step of forming a first electrode pad at an external edge part of a semiconductor chip mounting area of a supporting board, the supporting board having a main surface where the semiconductor chip mounting area is provided;
   a second step of fixing a rear surface of a semiconductor chip having a main surface, the main surface where a second electrode pad is formed, to an inside of an area of the main surface of the supporting board, the area where the first electrode pad is formed;

a third step of forming a first internal connecting terminal on the first electrode pad, and forming a second internal connecting terminal on the second electrode pad;

a fourth step of forming a first insulation layer on the main surface of the supporting board so that the semiconductor chip is covered and parts of the first internal connecting terminal and the second internal connecting terminal are exposed;

a fifth step of forming a wiring pattern including a wiring configured to electrically connect the first internal connecting terminal and the second internal connecting terminal to each other, on the first insulation layer;

a sixth step of forming a second insulation layer so that the wiring pattern formed on the first insulation layer is covered, the second insulation layer including an opening part configured to expose an external connecting terminal providing area of the wiring pattern, wherein, in the sixth step, the opening part is arranged in an area including a portion outside where the second internal connecting terminal is formed;

a seventh step of forming, by a blasting process, a groove part at a plurality of the semiconductor chip mounting areas and a scribing area of the supporting board including a substrate cutting position in which the plural semiconductor chip mounting areas are separated; and an eighth step of supplying a resin layer into the groove part, wherein, in the second step, the rear surface of the semiconductor chip is fixed to the inside of the external edge part of the semiconductor chip mounting area of the supporting board, the external edge part where the first electrode pad is formed;

in the fourth step, the first insulation layer is formed on the main surface of the supporting board, so that the semiconductor chip and the resin layer are covered with the first insulation layer and the parts of the first internal connecting terminal and the second internal connecting terminal are exposed; and after the fourth step, a portion including the resin layer situated in the scribing area is cut so that plural of the semiconductor devices are manufactured.

2. The manufacturing method of the semiconductor device, as claimed in claim 1,
wherein the seventh step includes
a seventh-A step of forming a mask configured to expose the scribing area to the main surface of the supporting board;
a seventh-B step of applying the blasting process to the scribing area via the mask so that the groove part is formed in the scribing area:
a seventh-C step of supplying uncured resin into the groove part via the mask; and
a seventh-D step of curing the resin and then removing the mask.

3. The manufacturing method of the semiconductor device, as claimed in claim 1,
wherein the groove part whose surface is roughened is formed by the blasting process.

4. The manufacturing method of the semiconductor device, as claimed in claim 1,
wherein the fourth step includes
a fourth-A step of forming the first insulation layer on the main surface of the supporting board, the first insulation layer being configured to cover the semiconductor chip, the first internal connecting terminal, and the second internal connecting terminal; and
a fourth-B step of exposing the parts of the first internal connecting terminal and the second internal connecting terminal through an upper surface of the first insulation layer and roughening a surface of the first insulation layer.

* * * * *